(12) United States Patent
Matsuda et al.

(10) Patent No.: US 7,274,010 B2
(45) Date of Patent: Sep. 25, 2007

(54) SEMICONDUCTOR OPTICAL AMPLIFIER DEVICE AMPLIFYING AN EXTERNALLY APPLIED LIGHT SIGNAL, SEMICONDUCTOR OPTICAL AMPLIFICATION DRIVING DEVICE AND SEMICONDUCTOR LIGHT RECEIVING APPARATUS

(75) Inventors: Kyoko Matsuda, Nara (JP); Toshiyuki Okumura, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/217,590

(22) Filed: Aug. 31, 2005

(65) Prior Publication Data

US 2006/0049336 A1 Mar. 9, 2006

(30) Foreign Application Priority Data

Sep. 3, 2004 (JP) ............................. 2004-257062

(51) Int. Cl.
*H01J 43/00* (2006.01)
*H01L 31/00* (2006.01)
*H01S 3/00* (2006.01)

(52) U.S. Cl. ........................... 250/214 LA; 250/214.1; 359/344; 359/333

(58) Field of Classification Search ............ 250/214 A, 250/214 LA, 214 LS, 214.1, 214 AG; 385/31, 385/32, 9, 10; 359/333, 335–339, 342, 344; 372/44.01, 50.1, 43.01, 45.013
See application file for complete search history.

(56) References Cited

U.S. PATENT DOCUMENTS

| 3,828,231 | A | * | 8/1974 | Yamamoto | .................. 359/344 |
| 5,283,799 | A | * | 2/1994 | Jacquet et al. | ........... 372/50.22 |
| 6,104,850 | A | * | 8/2000 | Dong | .......................... 385/29 |
| 6,205,161 | B1 | * | 3/2001 | Kappeler | .................. 372/38.1 |
| 2004/0156643 | A1 | * | 8/2004 | Frederiksen et al. | ........ 398/192 |

FOREIGN PATENT DOCUMENTS

| JP | 05-507156 A | 10/1993 |
| JP | 09-275224 A | 10/1997 |
| JP | 2004-214407 A | 7/2004 |
| JP | 2004-214603 A | 7/2004 |
| WO | WO-91/17474 A1 | 11/1991 |

* cited by examiner

*Primary Examiner*—Que Tan Le
*Assistant Examiner*—Pascal M. Bui-Pho
(74) *Attorney, Agent, or Firm*—Morrison & Foerster LLP

(57) ABSTRACT

A semiconductor optical amplifier device includes an active layer, an n-type InP substrate, an n-type InP clad layer, a p-type InP clad layer, p-electrodes and n-electrodes. The active layer is made of, e.g., InGaAsP, and includes a saturable absorption region and optical amplification regions. A common modulated current is injected into each optical amplification region through the p-electrode. A modulated current is injected into the saturable absorption region through the p-electrode independently of the optical amplification region. The active layer receives injection light produced by adding additional noise light to an externally applied light signal, and emits output light produced by amplifying the injection light.

16 Claims, 17 Drawing Sheets

(a)

(b)

(c)

SEMICONDUCTOR OPTICAL AMPLIFIER DEVICE AMPLIFYING AN EXTERNALLY APPLIED LIGHT SIGNAL, SEMICONDUCTOR OPTICAL AMPLIFICATION DRIVING DEVICE AND SEMICONDUCTOR LIGHT RECEIVING APPARATUS

This nonprovisional application is based on Japanese Patent Application No. 2004-257062 filed with the Japan Patent Office on Sep. 3, 2004, the entire contents of which are hereby incorporated by reference.

BACKGROUND OF THE INVENTION

1. Field of the Invention

The present invention relates to a semiconductor optical amplifier device, a semiconductor optical amplification driving device and a semiconductor light receiving apparatus, and particularly to a semiconductor optical amplifier device amplifying an externally applied light signal as well as a semiconductor optical amplification driving device and a semiconductor light receiving apparatus.

2. Description of the Background Art

At present, optical communication systems transmit light signals having modulated intensities through optical fibers. The light signal is reflected by an inner wall of the fiber many times when it moves through the fiber, and the signal intensity decreases due to absorption loss and dispersion loss every time the signal is reflected. Consequently, a signal waveform of the light signal deforms, and a signal-to-noise ratio (which will be referred to as an S/N ratio hereinafter) representing the quality of signal deteriorates so that the signal transmission quality lowers. The transmission loss increases with the times of reflection, i.e., with the transmission distance. The increase in transmission loss leads to restriction on the allowed transmission distance.

In addition to factors inside the optical fiber, various factors deteriorate the light signal when it passes through many devices such as repeaters and switches. Deterioration of the light signal becomes a major cause of increasing Bit Error Rate (BER). For preventing the increase in bit error rate, receivers capable of sensing deteriorated weak signals have been developed.

At present, many receivers for the optical communication have employed photodiodes (PDs) using InGaAs semiconductor for a long waveband. By increasing a thickness of a depletion layer of the photodiode, the sensitivity of the receiver can be improved. However, the thick depletion layer of the photodiode deteriorates a high response property, and it is difficult to use such photodiodes in superfast optical communication of a large-capacity in the future.

Recently, Japanese Patent Laying-Open No. 09-275224 has disclosed a new photodiode which is referred to as a Uni-Traveling-Carrier Photodiode (UTC-PD). In a conventional photodiode, holes and electrons form traveling carriers, and holes at a low traveling speed impede fast response. In view of this, UTC-PD does not use holes, and uses only electrons traveling at a high speed so that high response at several hundreds of gigaheltz can be achieved.

However, in the UTC-PD which improves fast response and high output property by using only electrons as traveling carriers, a performance of sensing weak signals is substantially the same as that of the conventional photodiode. Therefore, the UTC-PD is not suitable for light signals which are deteriorated due to transmission loss. Accordingly, such a technique has been developed that overcomes the transmission loss by amplifying the deteriorated signal instead of raising a performance of a receiver.

As a general signal amplifying technique, an optic-electric-optic conversion method has been used. The optic-electric-optic conversion method is a signal amplifying technique in which a light signal is received and converted into an electric signal by a light receiver such as a photodiode, then is amplified and shaped by an electric amplifier, a clock sampling circuit and others, and then is applied to a light source for converting it into a light signal again.

According to advance to high capacity and superspeed of the communication, it has been propelled to actualize all-optic signal processing which does not perform the optic-electric-optic conversion causing a time loss. Some techniques of the all-optic signal processing, which performs signal amplification and waveform shaping on the light signal without conversion, have been proposed.

For example, in a Semiconductor Optical Amplifier (SOA), light is injected into an element having a photoactive layer, and an amplified output light is obtained by causing dielectric emission. Since the SOA basically has the same structure as a semiconductor laser, a production method of the semiconductor laser can be applied to the SOA so that the SOA has an advantage that the structure is small and compact.

However, the method of amplifying the light intensity by the SOA cannot avoid occurrence of noise (ASE noise) due to amplified spontaneous emission. Accordingly, the S/N ratio of the output light deteriorates below a level which allows the use as the signal. Further, there is a lower limit intensity below which the signal cannot be amplified. For example, a quantum cryptography communication, which is expected as an ultimate safe communication method for the future, uses weak signals formed of photons serving as signal units, and therefore cannot use the SOA alone.

Accordingly, such technologies have been developed that overcome a transmission loss by performing waveform shaping on a deteriorated light signal. By way of example, light signal reproduction utilizing a bistable semiconductor laser having a saturable absorption region will now be described with reference to the drawings.

FIG. 17 illustrates an injection light and optical output characteristic curve of a bistable semiconductor laser with a conventional saturable absorption region. In FIG. 17, the abscissa gives light injected into an optical amplification region, and the ordinate gives an optical output intensity obtained depending on the injection light intensity.

As illustrated in FIG. 17, the conventional bistable semiconductor laser exhibits a characteristic of hysteresis in a relationship between the injection light and the optical output. In the following description, a state changing along a path indicated by solid line "A" will be referred to as a lower portion of the hysteresis, and a state changing along a path indicated by broken line "B" will be referred to as an upper portion of the hysteresis.

When the light is supplied into only the optical amplification region of the bistable semiconductor laser, the optical output increases along a path of A from P4 to P1 as illustrated in FIG. 17. In this operation, the light generated in the optical amplification region is absorbed to increase a carrier concentration in the saturable absorption region. Thereby, the optical absorbing effect in the saturable absorption region decreases.

When the light injected into the optical amplification region further increases, the optical absorbing effect becomes saturated. When the injection light intensity attains Pth1, the optical output rapidly increases from P1 to P2. In this specification, this Pth1 is referred to as a rising threshold of the hysteresis.

Conversely, when the light injected into the optical amplification region decreases, the optical output does not rapidly decreases because the saturable absorption region cannot immediately restore the light absorbing effect. Therefore, the optical output slowly decreases through P2 and P3 along a path indicated by B. In this operation, the carrier concentration and the optical output decrease.

When the light injected into the optical amplification region further decreases, the optical absorbing effect in the saturable absorption region is restored owing to decrease in carrier density and optical output. When the injection light intensity attains Pth2, the optical output rapidly decreases from P3 to P4. In this specification, this Pth2 is referred to as a falling threshold of the hysteresis.

The foregoing shape of the hysteresis is affected by the light injection or current injection into the saturable absorption region of the bistable semiconductor laser. When light is injected into the saturable absorption region, photons occur. When a current is injected into the saturable absorption region, photons occur as a result of injection of carriers. Consequently, the photons in the saturable absorption region increase. Thereby, the optical absorbing effect in the saturable absorption region decreases, and the whole hysteresis moves toward a lower side of an injected current value. Further, variations in quantity of the injection light or current cause variations in shape of the hysteresis.

By the light injection or current injection into the optical amplification region, a bias may be applied to the bistable semiconductor laser. When the light is injected into the optical amplification region, carriers occur as a result of injection of photons. Carriers also occur when the current is injected into the optical amplification region. Consequently, the carriers in the optical amplification region increase, and the bias is applied to the bistable semiconductor laser. Further, the bias quantity varies with variations in injection quantity of the light or current.

FIG. 18 illustrates operation characteristics of a conventional light signal reproduction device which uses a bistable semiconductor laser having a saturable absorption region. In FIG. 18, (a) indicates an injection light and optical output characteristic curve illustrated in FIG. 17, (b) indicates a light signal PIN injected into a bistable semiconductor laser having characteristics of (a), and (c) represents output light POUT obtained by injecting light signal PIN at (b) into the bistable semiconductor laser having the characteristics at (a).

Light signal PIN, which is modulated between a light intensity equal to or lower than threshold Pth2 and a light intensity equal to or larger than oscillation threshold Pth1 as illustrated in FIG. 18(b), is injected into the bistable semiconductor laser having the injection light and optical output characteristic illustrated at (a) in FIG. 18. Thereby, the bistable semiconductor laser provides output light POUT amplified as illustrated at (c) in FIG. 18. Japanese Patent Gazette No. 05-507156 has disclosed an example of a light signal reproduction device which performs optical amplification utilizing the bistable semiconductor laser. This will now be described with reference to the drawings.

FIG. 19 illustrates a manner of producing the light injected into the semiconductor laser in the bistable state. In FIG. 19, (a) illustrates deteriorated binary light signal PS, (b) illustrates a clock pulse light PCK applied to (a), and (c) illustrates injection light P1 produced by applying clock pulse light PCK at (b) to light signal PS at (a).

Binary light signal PS at (a) in FIG. 19 has a low intensity equal to or lower than oscillation threshold Pth1 of the bistable semiconductor laser even when it is at a high level. Clock pulse light PCK at (b) in FIG. 19 is produced such that its phase is completely synchronized with that of light signal PS at (a) in FIG. 19. Clock pulse light PCK at (b) in FIG. 19 is applied to injection light P1 at (c) in FIG. 19, and thereby injection light P1 has an amplitude to which an amplitude corresponding to application of clock pulse light PCK is added. Therefore, injection light P1 at (c) in FIG. 19 can vary between Pth1 and Pth2 according to binary values of light signal PS.

FIG. 20 illustrates a structure of a light signal reproduction device 100 performing optical amplification with a bistable semiconductor laser 121.

Referring to FIG. 20, bistable semiconductor laser 121 includes an optical amplification region 122, a saturable absorption region 123 and an active layer 126. Light signal PS illustrated at (a) in FIG. 19 and clock pulse light PCK illustrated at (b) in FIG. 19 are injected through active layer 126 into bistable semiconductor laser 121 which is kept in a state that a constant bias current IB (IB<oscillation current threshold value of bistable semiconductor laser 121) is injected thereinto.

Thereby, light signal PS receiving clock pulse light PCK varies above and below oscillation threshold Pth1 of bistable semiconductor laser 121 so that light signal reproduction device 100 can obtain output light PO having a large amplitude. Thereby, even when light signal PS has a low intensity, which cannot substantially exceeds oscillation threshold Pth1, light signal PS can move to an upper portion of the hysteresis owing to application of clock pulse light PCK. Consequently, amplified output light PO can be obtained.

Though the semiconductor laser in the bistable state can amplify a weak light signal nearly equal to the oscillation threshold, there is a restriction that the light signal can be amplified only if the threshold of the intensity of injection light varies between opposite sides of the threshold. Therefore, the optical amplification by the bistable semiconductor laser cannot be used for the light signal which has a small amplitude or an intensity attenuated below the threshold.

In a method of applying the clock signal to the attenuated light signal having the intensity lower than the threshold, and thereby varying the intensity between opposite sides of the threshold, it is necessary to synchronize completely the phase of the light signal with the phase of the clock signal. In superfast communication, it is generally difficult to adjust the signal for synchronization.

SUMMARY OF THE INVENTION

An object of the invention is to provide a semiconductor optical amplifier device, a semiconductor optical amplification driving device and a semiconductor optical receiver device, all of which can achieve low power consumption, can receive a light signal subjected to transmission loss and can amplify the light signal to reduce a bit error rate.

According to an aspect of the invention, a semiconductor optical amplifier device for amplifying a light signal includes an active layer including an optical amplification region and a saturable absorption region; an electrode of a first polarity type; and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

Preferably, the optical amplification region includes first and second optical amplification regions arranged on the opposite sides of the saturable absorption region, respectively. The injection light enters through an end plane of one of the first and second optical amplification regions, and the output light is emitted from an end plane of the other of the first and second optical amplification regions.

Preferably, a rate of a length of the saturable absorption region in an oscillator direction is in a range equal to or higher than 1% and smaller than 50%.

Preferably, the current injected into the optical amplification region and the saturable absorption region has an intensity adjusted to increase an amplitude of the output light and to reduce a bit error rate of the light signal.

Preferably, the current injected into the optical amplification region is a modulated current.

Preferably, the current injected into the optical amplification region is a constant current.

Preferably, the current injected into the saturable absorption region is a modulated current.

Preferably, the current injected into the saturable absorption region is a constant current.

Preferably, the injection light is produced by superimposing the light signal and noise light on each other.

Preferably, the noise light has a randomly changing intensity.

Preferably, the noise light is stochastically synchronized with the light signal.

Preferably, the noise light has an intensity adjusted to attain an optimum noise intensity minimizing a bit error rate of the light signal.

Preferably, the noise light has a cut-off frequency adjusted to reduce a bit error rate of the light signal.

Preferably, a difference between maximum and minimum values of the noise light is equal to or lower than $1/10$ of the amplitude of the light signal.

Preferably, the noise light is noise light of colored noise.

Preferably, the noise light is noise light of white noise.

Preferably, the semiconductor optical amplifier device is a semiconductor laser in a bistable state.

According to another aspect of the invention, a semiconductor optical amplification driving device for amplifying a light signal includes a semiconductor optical amplifier device; a photoelectric converter detecting a part of the output light, and converting the detected part into an electric signal; a filter extracting a predetermined frequency component of the electric signal; a preamplifier obtaining a difference between a current provided from the filter and a reference current, and adjusting an intensity; and a light source receiving a current provided from the preamplifier, and providing noise light corresponding to the current to the semiconductor optical amplifier device. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

Preferably, the light source is a semiconductor laser.

According to another aspect of the invention, a semiconductor optical amplification driving device for amplifying a light signal includes a semiconductor optical amplifier device; a photoelectric converter detecting a part of the output light, and converting the detected part into an electric signal; a feedback control circuit receiving the electric signal, and monitoring the state of the output light such that the light signal is stochastically synchronized with noise included in the light signal; a first current supply circuit supplying a first current to the optical amplification region according to a first control signal provided from the feedback control circuit; and a second current supply circuit supplying a second current to the saturable absorption region according to a second control signal provided from the feedback control circuit. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

According to still another aspect of the invention, a semiconductor optical amplification driving device for amplifying a light signal includes a semiconductor optical amplifier device; a photoelectric converter detecting apart of injection light, and converting the detected part into an electric signal; a feedback control circuit receiving the electric signal, and monitoring the state of the injection light such that the light signal is stochastically synchronized with noise included in the light signal; a first current supply circuit supplying a first current to the optical amplification region according to a first control signal provided from the feedback control circuit; and a second current supply circuit supplying a second current to the saturable absorption region according to a second control signal provided from the feedback control circuit. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

According to yet another aspect of the invention, a semiconductor optical amplification driving device for amplifying a light signal includes a semiconductor optical amplifier device; a first current supply circuit supplying a first current; a noise current supply circuit supplying a noise current stochastically synchronized with the light signal; a coupler coupling the first current to the noise current, and supplying the coupled currents to the optical amplification region; and a second current supply circuit supplying a second current to the saturable absorption region. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

Preferably, the first current supply circuit supplies a modulated current.

Preferably, the first current supply circuit supplies a constant current.

Preferably, the second current supply circuit supplies a modulated current.

Preferably, the second current supply circuit supplies a constant current.

According to further aspect of the invention, a semiconductor optical amplification driving device for amplifying a light signal includes a semiconductor optical amplifier device; a photoelectric converter detecting a part of the output light, and converting the detected part into an electric signal; a filter-extracting a predetermined frequency component of the electric signal; a preamplifier obtaining a difference between a current provided from the filter and a reference current, and adjusting an intensity; and a noise current supply circuit receiving a current provided from the preamplifier, and providing a noise current corresponding to the current to the active layer. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

Preferably, the filter is a low-pass filter.

Preferably, the noise current has a randomly changing intensity.

Preferably, the noise current is stochastically synchronized with the light signal.

Preferably, a cut-off frequency of the noise current is adjusted to reduce a bit error rate of the light signal.

Preferably, a difference between maximum and minimum values of the noise current is adjusted to increase an amplitude of the output light and to decrease a bit error rate of the light signal.

Preferably, a difference between maximum and minimum values of the noise current is equal to or smaller than a value of the current injected into the optical amplification region.

Preferably, the noise current is a noise current of colored noise.

Preferably, the noise current is a noise current of white noise.

According to further another aspect of the invention, a semiconductor light receiving apparatus for amplifying and receiving a light signal includes a semiconductor optical amplification driving device; and a light receiver receiving a part or the whole of the output light. The semiconductor optical amplification driving device includes a semiconductor optical amplifier device; a photoelectric converter detecting a part of the output light, and converting the detected part into an electric signal; a filter extracting a predetermined frequency component of the electric signal; a preamplifier obtaining a difference between a current provided from the filter and a reference current, and adjusting an intensity; and a light source receiving a current provided from the preamplifier, and providing noise light corresponding to the current to the semiconductor optical amplifier device. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

According to further another aspect of the invention, a semiconductor light receiving apparatus for amplifying and receiving a light signal includes a semiconductor optical amplification driving device; and a light receiver receiving a part or the whole of the output light. The semiconductor optical amplification driving device includes a semiconductor optical amplifier device; a photoelectric converter detecting a part of the output light, and converting the detected part into an electric signal; a feedback control circuit receiving the electric signal, and monitoring the state of the output light such that the light signal is stochastically synchronized with noise included in the light signal; a first current supply circuit supplying a first current to the optical amplification region according to a first control signal provided from the feedback control circuit; and a second current supply circuit supplying a second current to the saturable absorption region according to a second control signal provided from the feedback control circuit. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

According to further another aspect of the invention, a semiconductor light receiving apparatus for amplifying and receiving a light signal includes a semiconductor optical amplification driving device; and a light receiver receiving a part or the whole of the output light. The semiconductor optical amplification driving device includes a semiconductor optical amplifier device; a photoelectric converter detecting a part of injection light, and converting the detected part into an electric signal; a feedback control circuit receiving the electric signal, and monitoring the state of the injection light such that the light signal is stochastically synchronized with noise included in the light signal; a first current supply circuit supplying a first current to the optical amplification region according to a first control signal provided from the feedback control circuit; and a second current supply circuit supplying a second current to the saturable absorption region according to a second control signal provided from the feedback control circuit. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

According to further another aspect of the invention, a semiconductor light receiving apparatus for amplifying and receiving a light signal includes a semiconductor optical amplification driving device; and a light receiver receiving a part or the whole of the output light. The semiconductor optical amplification driving device includes a semiconductor optical amplifier device; a first current supply circuit supplying a first current; a noise current supply circuit supplying a noise current stochastically synchronized with the light signal; a coupler coupling the first current to the noise current, and supplying the coupled currents to the optical amplification region; and a second current supply circuit supplying a second current to the saturable absorption region. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

According to further another aspect of the invention, a semiconductor light receiving apparatus for amplifying and receiving a light signal includes a semiconductor optical amplification driving device; and a light receiver receiving a part or the whole of the output light. The semiconductor optical amplification driving device includes a semiconductor optical amplifier device; a photoelectric converter detecting a part of the output light, and converting the detected part into an electric signal; a filter extracting a predetermined frequency component of the electric signal; a preamplifier obtaining a difference between a current provided from the filter and a reference current, and adjusting an intensity; and a noise current supply circuit receiving a current provided from the preamplifier, and providing a noise current corresponding to the current to the active layer. The semiconductor optical amplifier device includes an active layer including an optical amplification region and a saturable absorption region, an electrode of a first polarity type, and an electrode of a second polarity type opposed to the electrode of the first polarity type. At least one of the electrodes of the first and second polarity types is divided for injecting a current into each of the optical amplification region and the saturable absorption region independently of the other, and the active layer receives injection light including the light signal, and emits output light produced by amplifying the injection light.

Preferably, the light receiver is a photoelectric converter.

Preferably, the semiconductor optical amplification driving device and the light receiver are integrated on the same substrate.

According to the invention, power consumption can be reduced, the light signal subjected to transmission loss can be received, and the bit error rate can be reduced by amplifying the light signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
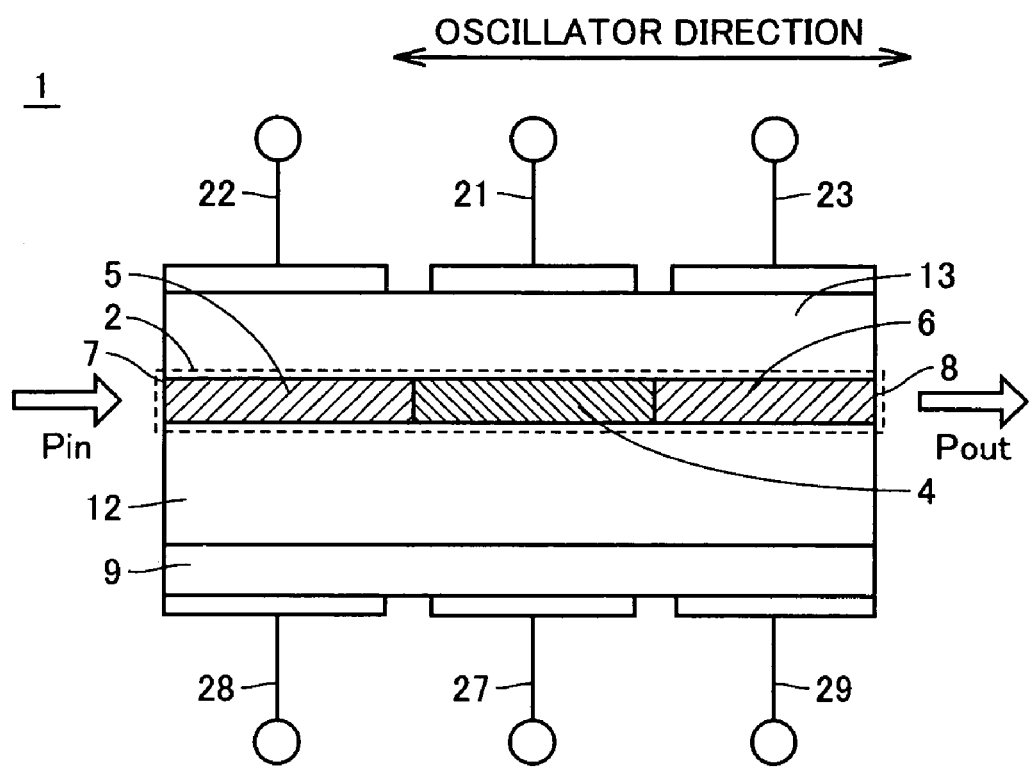
FIG. 1 is a cross section showing a schematic structure, on a side surface of an oscillator, of a semiconductor optical amplifier device 1 of a first embodiment of the invention.

Embodiments of the invention will now be described with reference to the drawings. In the drawings, the same or corresponding portions bear the same reference numbers, and description thereof is not repeated.

First Embodiment

FIG. 1 is a cross section showing a schematic structure, on a side surface of an oscillator, of a semiconductor optical amplifier device 1 of a first embodiment of the invention.

Referring to FIG. 1, a semiconductor optical amplifier device 1 of a first embodiment includes an active layer 2, an n-type InP (indium phosphide) substrate 9, an n-type InP clad layer 12, a p-type InP clad layer 13, p-electrodes 21-23 and n-electrodes 27-29. n-type InP clad layer 12 is formed on n-type InP substrate 9. Active layer 2 is formed on n-type InP clad layer 12.

Active layer 2 is made of InGaAsP (Indium Gallium Arsenic Phosphide), and includes a saturable absorption region 4 and optical amplification regions 5 and 6. On a side surface of an oscillator in semiconductor optical amplifier device 1, optical amplification regions 5 and 6 are located on the opposite sides of saturable absorption region 4, respectively. Optical amplification region 5 has an incidence plane 7 receiving injection light Pin. Optical amplification region 6 has an outgoing plane 8 from which output light Pout is emitted.

On active layer 2, p-type InP clad layer 13 is formed. p-electrodes 21-23 are arranged on p-type InP clad layer 13. p-electrode 21 is arranged corresponding to saturable absorption region 4, and p-electrodes 22 and 23 are arranged corresponding to optical amplification regions 5 and 6, respectively. p-type electrodes 21-23 inject the injection currents, respectively. n-electrodes 27-29 are arranged under n-type InP substrate 9 corresponding to p-electrodes 21-23, respectively.

A common modulated current is injected into optical amplification regions 5 and 6 through p-electrodes 22 and 23, respectively. A modulated current is injected into saturable absorption region 4 through p-electrode 21 independently of the current injection into optical amplification regions 5 and 6.

Saturable absorption region 4 and optical amplification regions 5 and 6 are formed to satisfy a condition that semiconductor optical amplifier device 1 attains a bistable state. When a DC current is injected into optical amplification regions 5 and 6, semiconductor optical amplifier device 1 attains the bistable state and operates. The length of saturable absorption region 4 in the oscillator direction is equal to about 10% of the whole oscillator length.

Corresponding to division of active layer 2 into three, i.e., saturable absorption region 4 and optical amplification regions 5 and 6, semiconductor optical amplifier device 1 of the first embodiment has the p-electrodes divided into three as well the n-electrodes divided into three. Thus, semiconductor optical amplifier device 1 has a structure which facilitates further independent control of the injection current into each of saturable absorption region 4 and optical amplification regions 5 and 6. In this manner, it is possible to avoid interference of the current flowing through saturable absorption region 4 with the currents flowing through optical amplification regions 5 and 6. FIG. 1 shows a structure in which both the p- and n-electrodes are divided. However, this is by way of example only, and it is merely required to divide only at least one kind of electrodes for independently injecting the current.

Injection light Pin to be injected through incidence plane 7 is produced by adding noise light, which represents intensity changes of colored noise, to a light signal formed of a binary value of "1" or "0". In contrast to white noise having no frequency band, the colored noise has a frequency band. The frequency band of the colored noise is represented by a cut-off frequency.

In active layer 2 of semiconductor optical amplifier device 1, impurities are added to saturable absorption region 4 for adjusting a carrier life. In this example, silicon is added as impurities at a rate of $1 \times 10^{19}$ cm$^{-3}$.

Description will now be given on an operation of semiconductor optical amplifier device 1. In the following description, such light will be referred to as "additional noise light" that has an intensity changing noncyclically and randomnly, and is intentionally injected into the active layer as noise with respect to the light signal. The additional noise light is distinguished from noise caused by a transmission path and others.

Figure 2:
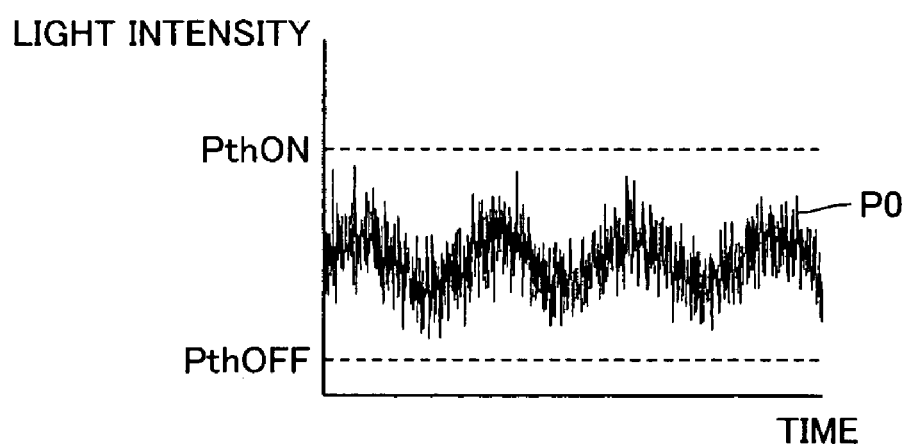
FIG. 2 illustrates a time waveform of a deteriorated light signal P0 having a binary value of "1" or "0".
Figure 3:
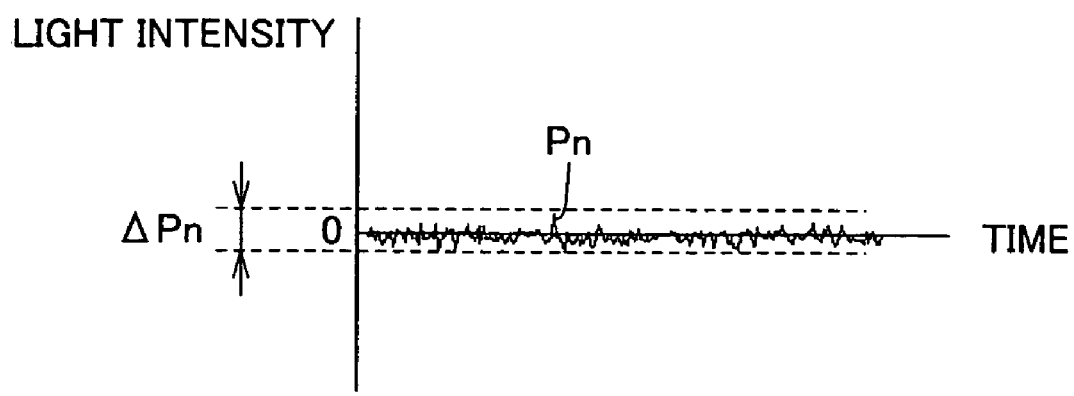
FIG. 3 illustrates a time waveform of additional noise light Pn.
Figure 4:
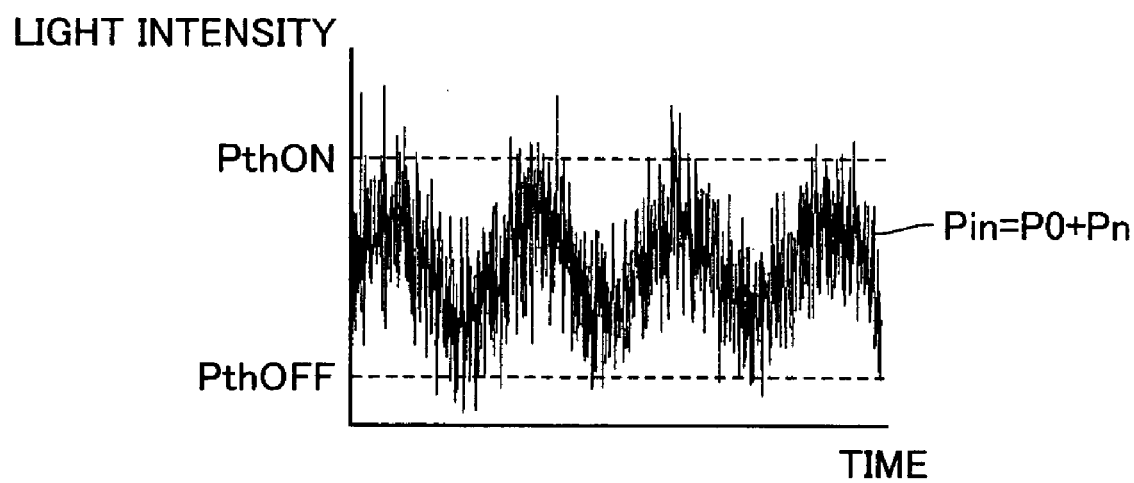
FIG. 4 illustrates a time waveform of injection light Pin formed by adding additional noise light Pn in FIG. 3 to light signal P0 in FIG. 2.

FIGS. 2-4 illustrate a manner of producing injection light Pin to be injected into active layer 2 of semiconductor optical amplifier device 1 of the first embodiment of the invention.

FIG. 2 illustrates a time waveform of a deteriorated light signal P0 having a binary value of "1" or "0". FIG. 3 illustrates a time waveform of additional noise light Pn. In the following description, a difference ΔPn between the maximum and minimum values of additional noise light Pn will be referred to as a "noise intensity" of additional noise light Pn. FIG. 4 illustrates a time waveform of injection light Pin(=P0+Pn) produced by adding additional noise light Pn in FIG. 3 to light signal P0 in FIG. 2. Injection light Pin thus produced is injected into active layer 2 of semiconductor optical amplifier device 1 in FIG. 1.

Figure 5:
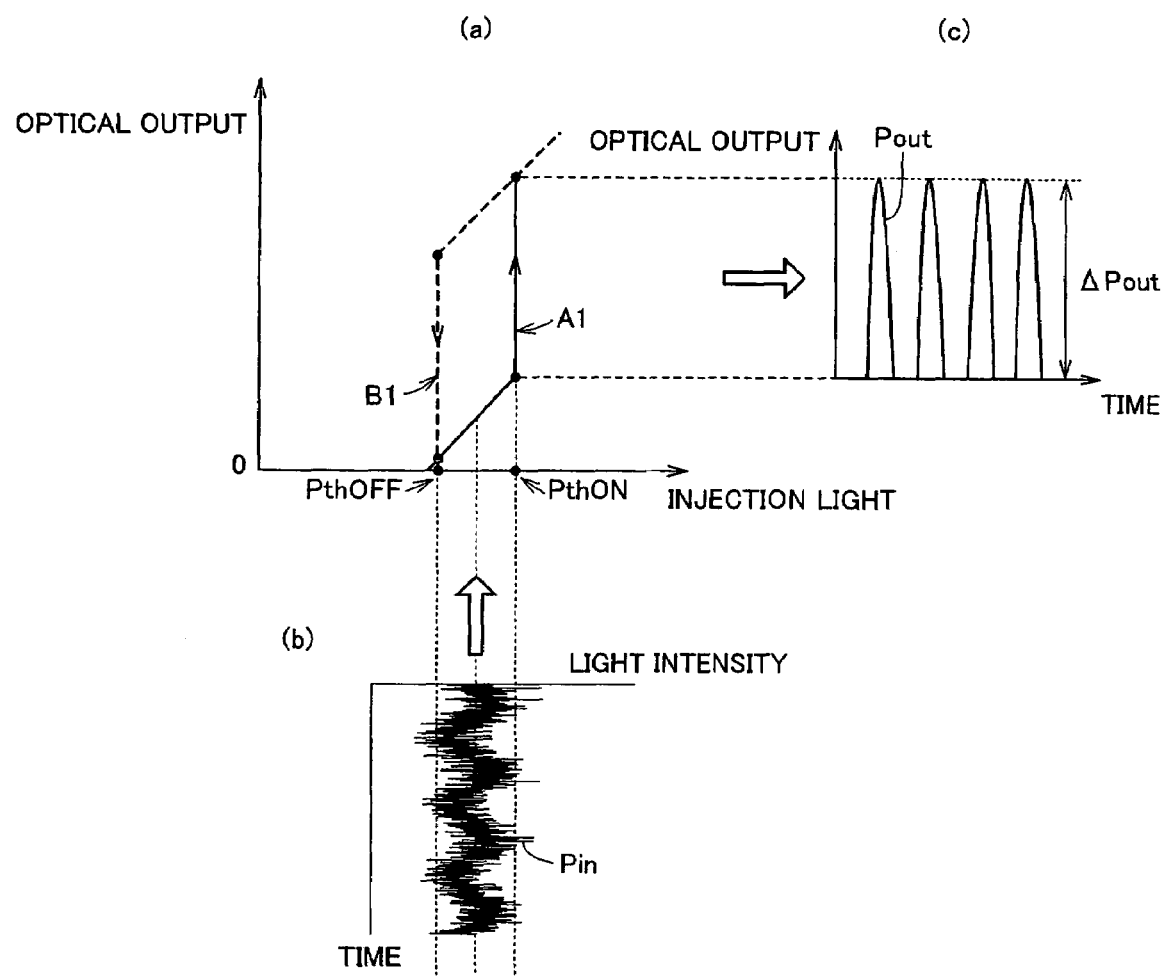
FIG. 5 illustrates operation characteristics of semiconductor optical amplifier device 1 of the first embodiment of the invention.
Figure 17:
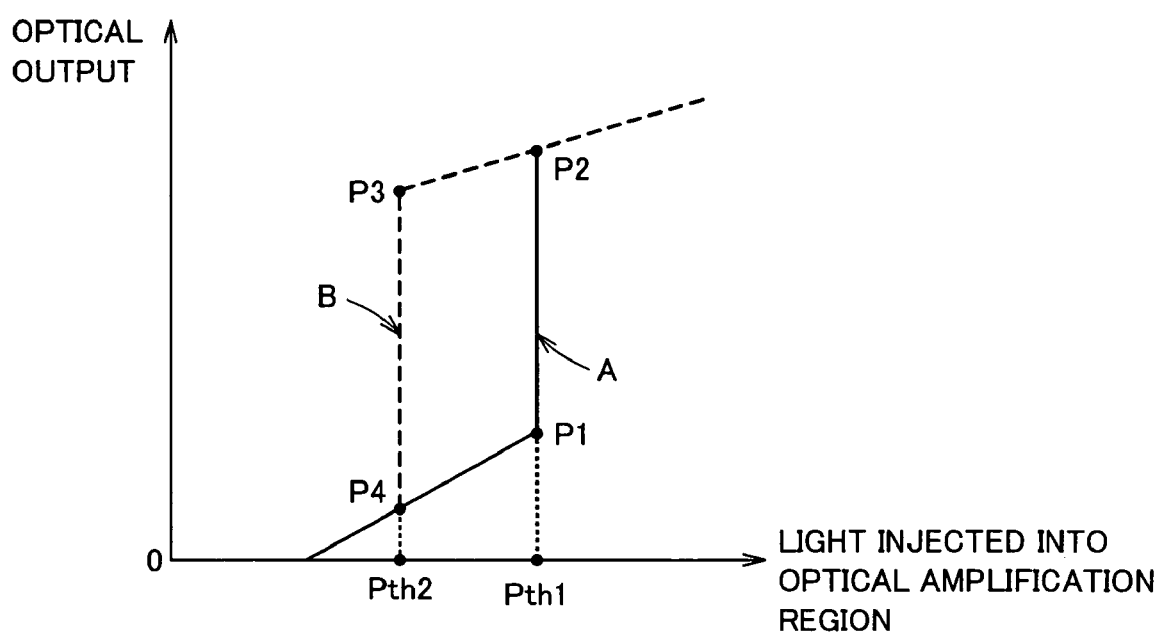
FIG. 17 illustrates injection light and optical output characteristic curve of a conventional bistable semiconductor laser with a saturable absorption region.
Figure 18:
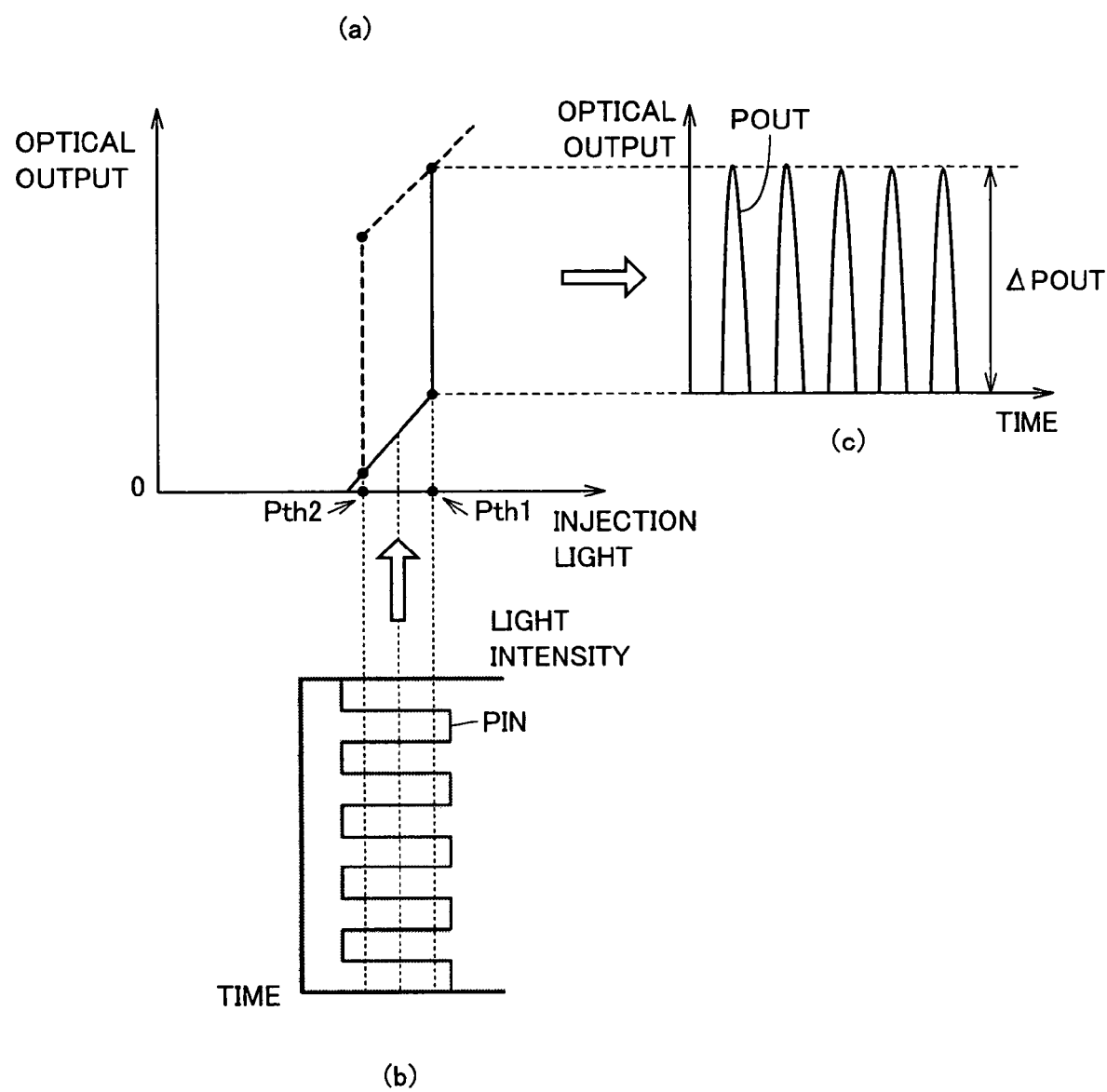
FIG. 18 illustrates operation characteristics of a conventional light signal reproduction device using a bistable semiconductor laser having a saturable absorption region.
Figure 19:
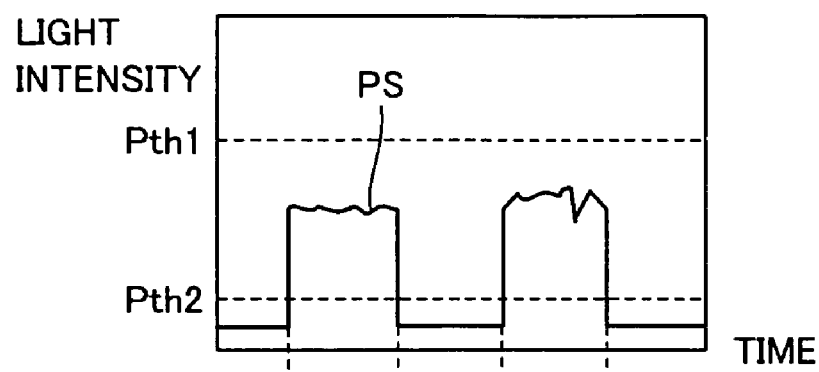
FIG. 19 illustrates a manner of producing light injected into a semiconductor laser in a bistable state.
Figure 19:
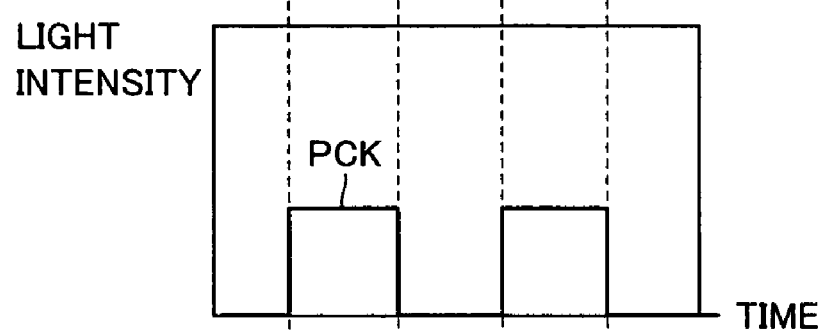
Figure 19:
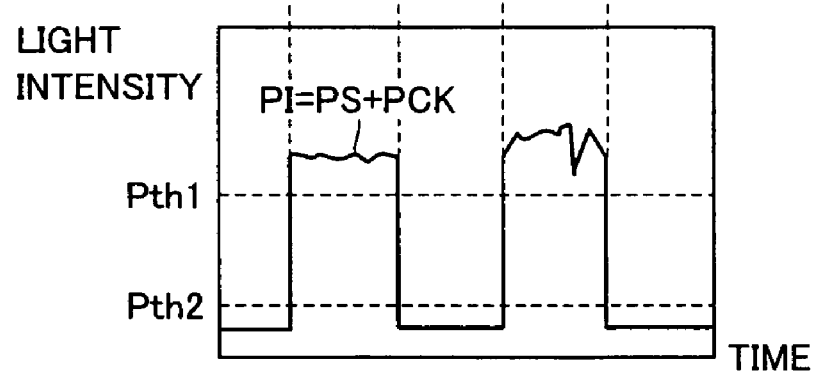
Figure 20:
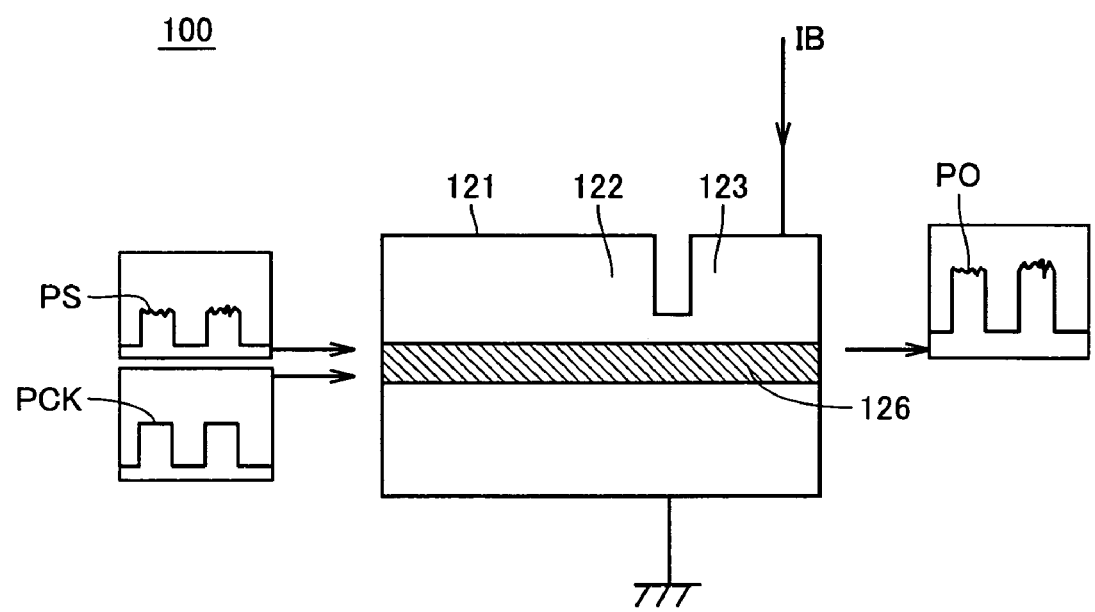
FIG. 20 shows a structure of a light signal reproduction device 100 performing optical amplification with a bistable semiconductor laser 121.

FIG. 5 illustrates operation characteristics of semiconductor optical amplifier device 1 of the first embodiment of the invention (also see illustrations in FIGS. 17 and 18).

Referring to FIG. 5, (a) illustrates injection light and optical output characteristics of semiconductor optical amplifier device 1 in FIG. 1, (b) illustrates a time waveform of injection light Pin already described with reference to FIG. 4, and (c) illustrates a time waveform of output light Pout obtained by injecting injection light Pin at (b) into semiconductor optical amplifier device 1. At (a) in FIG. 5, the abscissa gives the injection light, and the ordinate gives the optical output obtained depending on the injection light.

At (a) in FIG. 5, PthON indicates a light intensity at which the state of the optical output changes from the state at a lower portion of the hysteresis indicated by solid line A1 to an upper portion of the hysteresis indicated by broken line B1. Thus, PthON indicates a rising threshold of the hysteresis. PthOFF indicates a light intensity at which the state changes from the upper portion of the hysteresis to the lower portion of the hysteresis, and thus indicates a falling threshold of the hysteresis. Rising and falling thresholds PthON and PthOFF of the hysteresis are also illustrated in FIGS. 2 and 4.

Referring to FIG. 2, the intensity of light signal P0, to which additional noise light Pn is not yet applied, is deteriorated so that the maximum value thereof is substantially smaller than rising threshold PthON of the hysteresis. Thereby, when light signal P0 in FIG. 2 is merely injected into active layer 2 of semiconductor optical amplifier device 1, the optical output remains at the hysteresis lower portion on the injection light and optical output characteristic curve at (a) in FIG. 5, and cannot move to the hysteresis upper portion.

Injection light Pin, which is produced by adding additional noise light Pn in FIG. 3 to light signal P0 in FIG. 2, has the light intensity exceeding rising threshold PthON of the hysteresis at the vicinity of the maximum value "1" of light signal P0. When the intensity passes the maximum value of light signal P0, the light intensity becomes lower than PthON again. Further, at the vicinity of the minimum value "0", the intensity becomes equal to or lower than PthOFF, and the optical output moves to the lower portion of the hysteresis.

As described above, the injection light Pin exceeds the rising/falling thresholds, and thereby the optical output moves between the upper and lower portions of the hysteresis. Consequently, as illustrated at (c) in FIG. 5, "1" and "0" of light signal P0 are enhanced, and output light Pout having a large amplitude can be obtained. When additional noise light Pn is added to light signal P0, additional noise light Pn is appropriately adjusted such that output light Pout may have a noise intensity and a cut-off frequency achieving an effect of reducing the noise due to the transmission path and others.

If the noise intensity of additional noise light Pn is excessively small, the optical output can not move to the upper portion of the hysteresis, and it is impossible to provide output light Pout having an amplitude of a magnitude required for reducing the noise due to the transmission path and others. Conversely, if the noise intensity of additional noise light Pn is excessively large, the optical output moves to the upper portion of the hysteresis regardless of "1" or "0" of light signal P0, and therefore the intensity of output light Pout changes randomly so that the bit error rate cannot be reduced. For these reasons, the above adjustment of additional noise light Pn is performed.

As the cut-off frequency of additional noise light Pn increases, the noise intensity correspondingly increases, and this affects the movement between the upper and lower portions of the hysteresis. In FIG. 2, the intensity corresponding to the lower binary value "0" of light signal P0 is larger than PthOFF. Even if it is equal to or lower than PthOFF, the effect of reducing the noise due to the transmission path and others can be achieved by adjusting the noise intensity and cut-off frequency of additional noise light Pn.

As described above, additional noise light Pn is adjusted to achieve the appropriate noise intensity and cut-off frequency which can achieve the effect of reducing the bit error rate, and is injected together with light signal P0 into optical amplification regions 5 and 6 of semiconductor optical amplifier device 1 in FIG. 1. Rising threshold PthON of semiconductor optical amplifier device 1 is adjusted to take a value which does not substantially reduce the noise due to the transmission path and others even if only light signal P0 is injected into optical amplification regions 5 and 6. Thus, rising threshold PthON is adjusted to take such a value that the optical output obtained by injecting only light signal P0 into optical amplification regions 5 and 6 can take only a minute value corresponding to the lower portion of the hysteresis.

By appropriately adjusting the noise intensity and cut-off frequency of additional noise light Pn, and adding the additional noise light Pn thus adjusted to light signal P0, the value of injection light Pin is randomly changed around the value of light signal P0.

Also, the maximum and/or minimum values of light signal P0 are stochastically synchronized with the intensity of additional noise light Pn injected together with light signal P0 into optical amplification regions 5 and 6. Thereby, the optical output moves between the upper and lower portions of the hysteresis in accordance with the timing of light signal P0 attaining "0" or "1". Thereby, the output amplitude of the output light increases corresponding to the intensity difference between the upper and lower portions of the hysteresis, and output light Pout of the large amplitude can be obtained.

Owing to the foregoing, weak light signal P0 can be amplified to provide output light Pout having the large amplitude and the high light intensity. Thereby, the S/N ratio of output light Pout is improved, and the effect of reducing the noise due to the transmission path and others can be obtained. Consequently, the bit error rate of output light Pout can be reduced.

Further, semiconductor optical amplifier device 1 in FIG. 1 injects the current into optical amplification regions 5, 6 and saturable absorption region 4 independently, and therefore the hysteresis can be controlled by the current injection. Thereby, it is possible to perform driving with a lower current and to adjust the amplitude of output light Pout by reducing the rising threshold PthON.

A phenomenon, in which the S/N ratio of the signal is improved by appropriately adding the noise, is referred to as "stochastic resonance".

It may be attempted to add clock light or cyclic signal light to light signal P0 instead of additional noise light Pn for movement to the upper portion of the hysteresis. In this case, however, output light Pout of a large amplitude can be obtained only when the clock light or the cyclic signal light has completely the same phase and period as the output light Pout, or has the phase and period accurately equal to multiples of them of output light Pout. Accordingly, when the waveform of light signal P0 wavers due to thermal noise or the like of the circuit, this reduces the effect of reducing the noise due to the transmission path or the like.

In contrast to this, additional noise light Pn having a randomly changing intensity has various frequency components, and therefore is resistant to wavering of the signal waveform so that it can maintain the effect of reducing the noise due to the transmission path and others. Further, there is such an advantage that additional noise light Pn can be produced with smaller power consumption than the cyclic signal light.

Figure 6:
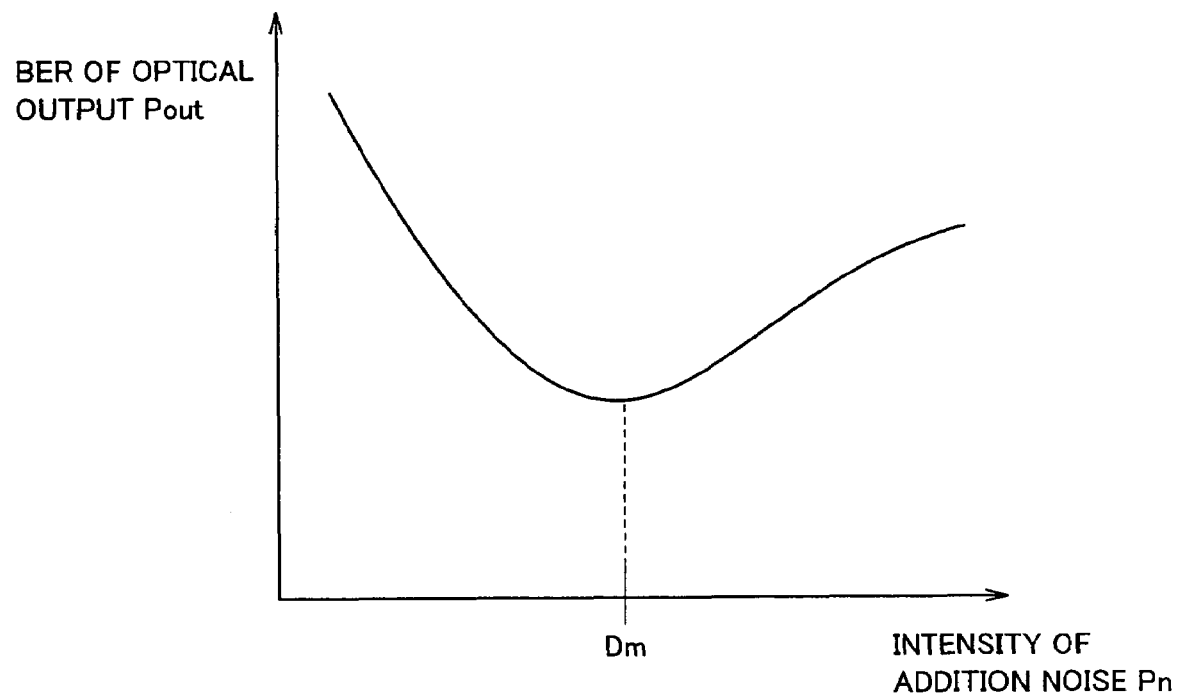
FIG. 6 illustrates variations of a bit error rate of output light Pout and a noise intensity of additional noise light Pn.

FIG. 6 illustrates variations of a Bit Error Rate (BER) of output light Pout and the noise intensity of additional noise light Pn.

As illustrated in FIG. 6, the bit error rate becomes minimum when optimum noise intensity Dm is attained. In the first embodiment, additional noise light Pn having this optimum noise intensity Dm is added to light signal P0. Thereby, appropriate additional noise light Pn pushes weak light signal P0 to the upper portion of the hysteresis to allow production of output light Pout having a large amplitude and an improved S/N ratio. In the first embodiment, additional noise light Pn is adjusted to have optimum noise intensity Dm providing output light Pout of the minimum bit error rate.

According to semiconductor optical amplifier device 1 of the first embodiment, as described above, even if light signal P0 is deteriorated and weakened to or below the oscillation threshold of the device, it is possible to receive light signal P0 and to obtain output light Pout amplified to have enhanced binary values. Thereby, the S/N ratio of output light Pout is improved, and output light Pout, of which noise due to the transmission path and others is reduced, can be obtained with low power.

Since additional noise light Pn used in this embodiment is resistant to wavering of the signal cause by circuit noise and heat, wide parameter setting can be employed for the driving. Thereby, the noise due to the transmission path and others can be easily reduced so that the bit error rate of output light Pout can be reduced.

Incidence plane 7 and outgoing plane 8 in FIG. 1 may not be independent of each other. Even in this case, it is possible to obtain output light Pout having the reduced bit error rate. However, it is desirable to provide the incidence and outgoing planes 7 and 8 independent of each other as illustrated in FIG. 1 because this structure facilitates the control of injection light Pin and output light Pout, and also facilitates the adjustment of optical axes in the optical system.

The effect of reducing the bit error rate can be achieved even if the cut-off frequency of additional noise light Pn is not appropriately adjusted. However, the cut-off frequency affects the noise intensity so that the optimum noise intensity can be obtained more easily by such adjustment, and also the effect of reducing the bit error rate can be obtained. Therefore, the adjustment of the cut-off frequency is desirable.

In FIG. 1, saturable absorption region 4 may have a length in the oscillator direction at a rate other than about 10%. Even in this case, the effect of reducing the bit error rate can be achieved.

However, as the length in the oscillator direction of saturable absorption region 4 decreases in rate, it becomes more difficult to achieve the bistable state of semiconductor optical amplifier device 1. Particularly, if it is attempted to produce the semiconductor element in the stable state with the rate smaller than 1%, a production process requires an extremely long time, and selection of a diffusion material and others becomes extremely difficult. Accordingly, it is desired that saturable absorption region 4 has the length in the oscillator direction at a rate equal to or larger than 1%.

Conversely, if the length of saturable absorption region 4 in the oscillator direction increases in rate, the oscillation threshold rises. Particularly, if the rate exceeds 50%, the power consumption extremely increases, and generated heat increases consequently.

As the length of saturable absorption region 4 in the oscillator direction increases in rate, the injection current must be increased for optimizing the shape of the hysteresis. Particularly, if the rate exceeds 50%, the power consumption extremely increases, and thus generated heat increases. Further, if the hysteresis does not have an optimum shape, this decreases the effect of reducing the noise due to the transmission path and others, and the amplification of the optical output decreases.

For these reasons, it is desired that saturable absorption region 4 has the length in the oscillator direction at a rate from 1% to 50%. This range can easily satisfy the bistable state, can lower the oscillation threshold, and can appropriately determine the shape of the hysteresis. Further, the power consumption and the generated heat are small so that it becomes easier to obtain the effect of reducing the noise due to the transmission path and others, and to satisfy the required conditions for element production.

Referring to FIG. 6, the intensity of additional noise light Pn is adjusted to achieve optimum noise intensity Dm minimizing the bit error rate (BER). However, the intensity of additional noise light Pn is not restricted to this, and may be adjusted in another manner provided that obtained output light Pout achieves the noise intensity in a range satisfying the value of bit error rate required for the optical communication. In this case, if the difference between the maximum and minimum values of additional noise light Pn is equal to or lower than 1/10 of the amplitude of injection light Pin of semiconductor optical amplifier device 1, output light Pout reducing the bit error rate can be obtained.

If additional noise light Pn has an excessively large intensity, the waveform of output light Pout deforms so that the noise does not decrease. At least in the case where noise intensity ΔPn of additional noise light Pn is larger than the amplitude of light signal P0, the waveform and period of light signal P0 cannot be reproduced so that light signal P0 cannot be detected. In contrast to this, if the noise intensity of additional noise light Pn is equal to or lower than 1/10 of the amplitude of injection light Pin, the amplitude of output light Pout can be increased to improve the value of BRE. Thereby, such intensity can improve the effect of reducing the noise due to the transmission path and others, and thus is preferable.

Though the colored noise is used as additional noise light Pn, noise other than the colored noise can achieve the effect of reducing the bit error rate provided that the intensity changes noncyclically and randomly. However, by using the colored noise, it is possible to adjust the frequency band of the colored noise according to the cut-off frequency. Therefore, the colored noise has an advantage that it can achieve more easily the effect of reducing the bit error rate by adjusting the frequency band of the colored noise in accordance with the frequency of light signal P0.

Though the cyclic signal light is used as light signal P0, noncyclic signal light can also be used to obtain the effect of reducing the bit error rate.

In FIG. 1, each kind of electrodes are divided to provide three p-electrodes or three n-electrodes. However, the number of electrodes is not restricted to three, and another semiconductor optical amplifier device, which has the bistable state and employs two or more p-electrodes and two or more n-electrodes, can likewise achieve the effect of reducing the noise due to the transmission path and others. However, as is done in semiconductor optical amplifier device 1 illustrated in FIG. 1, the structure may have two optical amplification regions, and may employ the electrodes respectively corresponding to these regions, and this structure has an advantage that each of the injection light Pin and output light Pout can be controlled more easily.

In FIG. 1, the optical output having the reduced bit error rate can be obtained even when additional noise light Pn is injected into saturable absorption region 4 instead of optical amplification regions 5 and 6. In this case, saturable absorption region 4 is likely to be saturated, and the upper limit of the light injection quantity lowers so that it becomes difficult to determine appropriately the noise intensity of additional noise light Pn. In the above case, however, the hysteresis shape can be adjusted more easily by the injection of additional noise light Pn into saturable absorption region 4. By changing the injection quantity of additional noise light Pn, rising and falling thresholds PthON and PthOFF of semiconductor optical amplifier device 1 can be changed, and thereby the hysteresis shape can be adjusted.

Therefore, by appropriately adjusting the noise intensity and cut-off frequency of additional noise light Pn such that rising threshold PthON rises or falls corresponding to "0" or "1" of injection light Pin, output light Pout having a large amplitude and an improved S/N ratio can be obtained.

Further, instead of injecting additional noise light Pn into optical amplification regions 5 and 6 of semiconductor optical amplifier device 1 after adding additional noise light Pn to light signal P0, additional noise light Pn may be injected via another circuit into optical amplification regions 5 and 6. In this case, an additional circuit is required, and an optical axis thereof must be adjusted. However, the noise intensity can be adjusted more easily.

Instead of the InGaAsP semiconductor, semiconductor optical amplifier device 1 may be a semiconductor laser using another material such as AlGaAs (aluminum gallium arsenide), InP (indium phosphide), GaInNAs (gallium nitride indium arsenide), GaN (gallium nitride) or II-VI groups.

Silicon is added as impurities for adjusting the carrier life at $1 \times 10^{19}$ cm$^{-3}$ into saturable absorption region 4 of active layer 2 of semiconductor optical amplifier device 1. However, the rate may take another value provided that the rate can attain conditions of attaining the bistable state of semiconductor optical amplifier device 1.

Though light signal P0 is a binary signal, a signal of another type such as a signal of NRZ (Non-Return to Zero) may be used.

Output light Pout provided from semiconductor optical amplifier device 1 may be received by a light receiver. This achieves an advantage that a part of received output light Pout can be utilized by converting it into an electric signal by photoelectric converter or the like. Further, the above light receiver can be integrated with semiconductor optical amplifier device 1 on the same substrate, in which case a cost can be reduced as compared with the individual arrangement, and it is not necessary to align optical axes of the semiconductor optical amplifier device 1 and this light receiver.

According to the first embodiment, as described above, injection light Pin produced by applying additional noise light Pn to light signal P0 is injected into the semiconductor optical amplifier device 1 in the bistable state, and thereby it is possible to provide output light Pout achieving low power consumption, reducing a load on circuits and achieving good noise characteristics. Thereby, the effect of reducing the noise due to the transmission path and others can be reduced in output light Pout so that the bit error rate can be reduced.

First Modification of the First Embodiment

A semiconductor optical amplifier device 1A, which is a modification of semiconductor optical amplifier device 1 of the first embodiment, is the same as semiconductor optical amplifier device 1 of the first embodiment except for that white noise is used as additional noise light Pn instead of colored noise. Semiconductor optical amplifier device 1A can likewise amplify the deteriorated signal to provide the optical output having the reduced bit error rate.

Semiconductor optical amplifier device 1A cannot adjust the cut-off frequency of the additional noise light for achieving the maximum effect of reducing the bit error rate, and it becomes difficult to cause the stochastic resonance phenomenon. However, semiconductor optical amplifier device 1A can have a simple structure and a compact packaging.

Second Modification of the First Embodiment

A semiconductor optical amplifier device 1B, which is another modification of semiconductor optical amplifier device 1 of the first embodiment, is the same as semiconductor optical amplifier device 1 of the first embodiment except for that a constant current is injected into saturable absorption region 4 instead of the modulated current. Semiconductor optical amplifier device 1B can likewise amplify the deteriorated signal to provide the optical output having the reduced bit error rate.

Semiconductor optical amplifier device 1B is difficult to adjust for achieving the maximum effect of reducing the bit error rate. However, only one modulation circuit is required, and the saturation quantity of saturable absorption region 4 can be kept constant so that the injection light and output light characteristics can be easily stabilized. Though semiconductor optical amplifier device 1B uses the colored noise as the additional noise light, it may use the while noise similarly to semiconductor optical amplifier device 1A, in which case the optical output having the amplified amplitude and the reduced bit error rate can likewise be obtained.

Third Modification of the First Embodiment

A semiconductor optical amplifier device 1C, which is still another modification of semiconductor optical amplifier device 1 of the first embodiment, is the same as semiconductor optical amplifier device 1 of the first embodiment except for that a constant current is injected into optical amplification regions 5 and 6 instead of the modulated current. Semiconductor optical amplifier device 1C can likewise amplify the deteriorated signal to provide the optical output having the reduced bit error rate.

Semiconductor optical amplifier device 1C is difficult to adjust for achieving the maximum effect of reducing the bit error rate. However, the modulated current injected into saturable absorption region 4 directly varies the threshold. Therefore, it is easy to vary significantly the optical output even if the amplitude is small, and the power consumption can be smaller than that in the case of injecting the modulated current into optical amplification regions 5 and 6.

The constant current can be injected into either optical amplification region 5 or 6 in semiconductor optical amplifier device 1C, and in either case, the effect of reducing the bit error rate as well as the optical amplification effect can be achieved. Though semiconductor optical amplifier device 1C uses the colored noise as additional noise light, it may use the white noise similarly to semiconductor optical amplifier device 1A, and thereby can likewise provide the optical output having the amplified amplitude and the reduced bit error rate.

Fourth Modification of the First Embodiment

A semiconductor optical amplifier device 1D, which is yet another modification of semiconductor optical amplifier device 1 of the first embodiment, is the same as semiconductor optical amplifier device 1 of the first embodiment except for that constant currents are injected into saturable absorption region 4 and optical amplification regions 5 and 6 instead of the modulated currents. Semiconductor optical amplifier device 1D can likewise amplify the deteriorated signal to provide the optical output having the reduced bit error rate.

Semiconductor optical amplifier device 1D is difficult to adjust for achieving the maximum effect of reducing the bit error rate. However, the modulation circuit is not required so that the structure can be simple, and the power consumption can be small. Though semiconductor optical amplifier device 1D uses the colored noise as additional noise light, it may use the white noise similarly to semiconductor optical amplifier device 1A, and thereby can likewise provide the optical output having the amplified amplitude and the reduced bit error rate.

Second Embodiment

Figure 7:
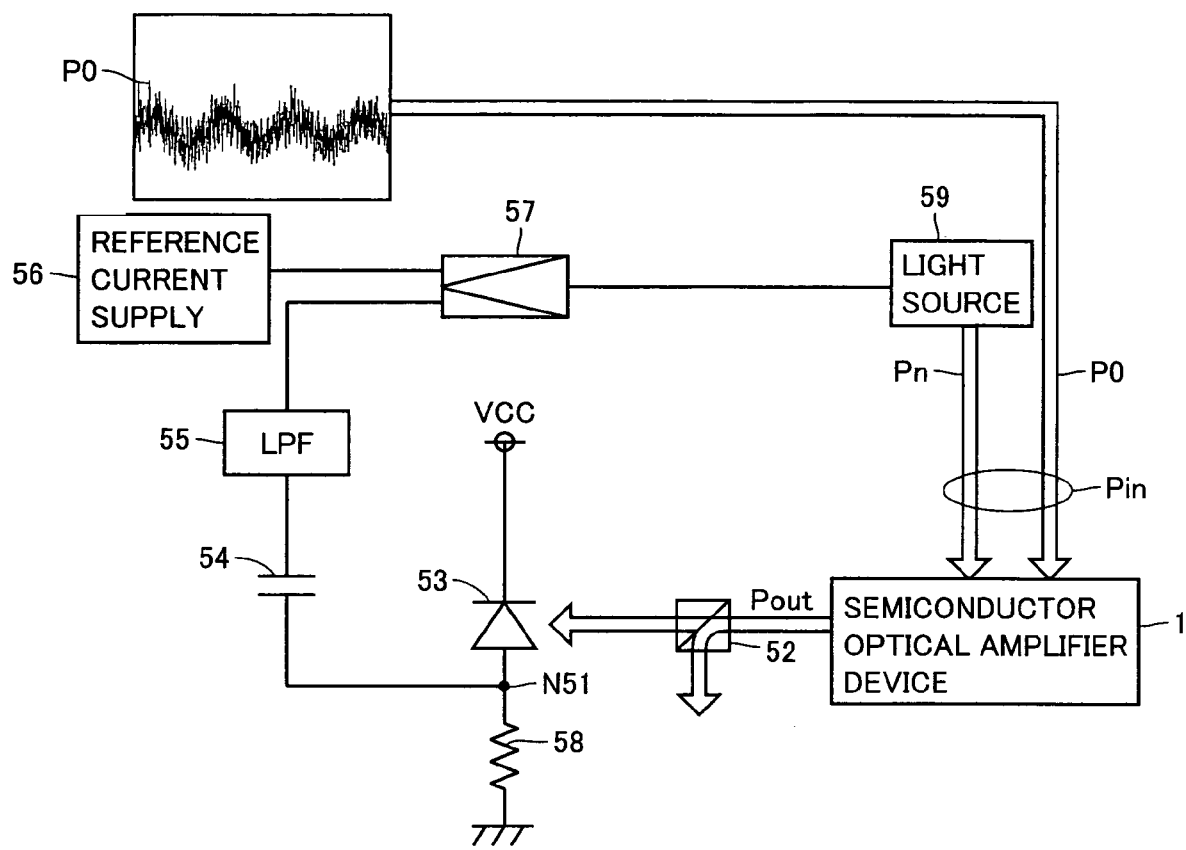
FIGS. 7, 8 and 9 schematically show structures of semiconductor optical amplification driving devices 10A, 10B and 10C of second, third and fourth embodiments of the invention, respectively.

FIG. 7 shows a schematic structure of a semiconductor optical amplification driving device 10A of a second embodiment of the invention.

Referring to FIG. 7, semiconductor optical amplification driving device 10A of the second embodiment is formed of semiconductor optical amplifier device 1 and its driving device. More specifically, semiconductor optical amplification driving device 10A includes semiconductor optical amplifier device 1, a beam splitter 52, a photoelectric converter 53, a coupling capacitor 54, a low-pass filter (LPF) 55, a reference current supply 56, a preamplifier 57, a resistance 58 and a light source 59.

Semiconductor optical amplifier device 1 shown in FIG. 7 is the same as the semiconductor optical amplifier devices in the bistable state which have the saturable absorption regions, and are already described in connection with the first embodiment and its first to fourth modifications. Therefore, description of the same or corresponding portions is not repeated. The injection current injected through the p-electrode of semiconductor optical amplifier device 1 is the same as that already described in connection with the first embodiment.

Semiconductor optical amplifier device 1 receives injection light Pin produced by adding additional noise light Pn provided from light source 59 to light signal P0, and provides output light Pout. It is assumed that light signal P0 is already deteriorated by noises due to the transmission path and others. Beam splitter 52 splits output light Pout to provide a part of output light Pout to photoelectric converter 53.

The photoelectric converter 53 is connected between the power supply node and a node N51, and detects the portion of output light Pout provided from beam splitter 52. Resistance 58 is connected between node N51 and the ground node.

The part of output light Pout detected by photoelectric converter 53 is provided as an electric signal to low-pass filter 55 through coupling capacitor 54. Low-pass filter 55 extracts, from the electric signal thus provided, only components at or below an appropriate cut-off frequency which achieves the effect of reducing the bit error rate of light signal P0.

Preamplifier 57 adjusts the intensity by obtaining a difference between the current of the frequency components extracted by low-pass filter 55 and the current provided from reference current supply 56. Light source 59 receives the adjusted current provided from preamplifier 57, and injects additional noise light Pn to the optical amplification region of semiconductor optical amplifier device 1.

For example, a semiconductor laser is used as light source 59. When the semiconductor laser is used as light source 59, additional noise light Pn can be adjusted easily because a linear relationship is present between the input current and the optical output of the semiconductor laser. Consequently, output light Pout can be modulated according to the current provided from preamplifier 57. The noise intensity of additional noise light Pn is adjusted to minimize the bit error rate of light signal P0 similarly to the first embodiment.

As described above, instead of using the noise light source, semiconductor optical amplification driving device 10A of the second embodiment detects a part of output light Pout by photoelectric converter 53, and extracts a part of the its band by low-pass filter 55. Semiconductor optical amplification driving device 10A produces additional noise light Pn to be added to light signal P0 based on the difference between the current of the frequency components extracted by low-pass filter 55 and the current provided from reference current supply 56. The cooperative effect of light signal P0 and additional noise light Pn provide output light Pout having the amplified amplitude and the reduced bit error rate.

In the case where photoelectric converter 53 detects a part of output light Pout of semiconductor optical amplifier device 1, the intensity of available output light Pout decreases, but the power consumption can small because the noise light source is not required. Since additional noise light Pn is produced by using a part of output light Pout of semiconductor optical amplifier device 1, additional noise light Pn can be produced by a simple device structure.

Though low-pass filter 55 is used in FIG. 7, another filter such as a high-pass filter or a band-pass filter may be used provided that the filter can appropriately adjust the cut-off frequency of additional noise light Pn. However, the structure employing the low-pass filter can use additional noise light Pn as the colored noise, and can cause the stochastic resonance phenomenon more easily so that the effect of reducing the bit error rate can be achieved more easily.

According to the second embodiment, as described above, the noise light source is not used, and alternatively, photoelectric converter 53 detects a part of output light Pout of semiconductor optical amplifier device 1, and additional noise light Pn is produced based on it. Thereby, high output light Pout having the improved S/N ratio can be produced with low power consumption and a low load on the circuits. This reduces the bit error rate of output light Pout.

Third Embodiment

Figure 8:
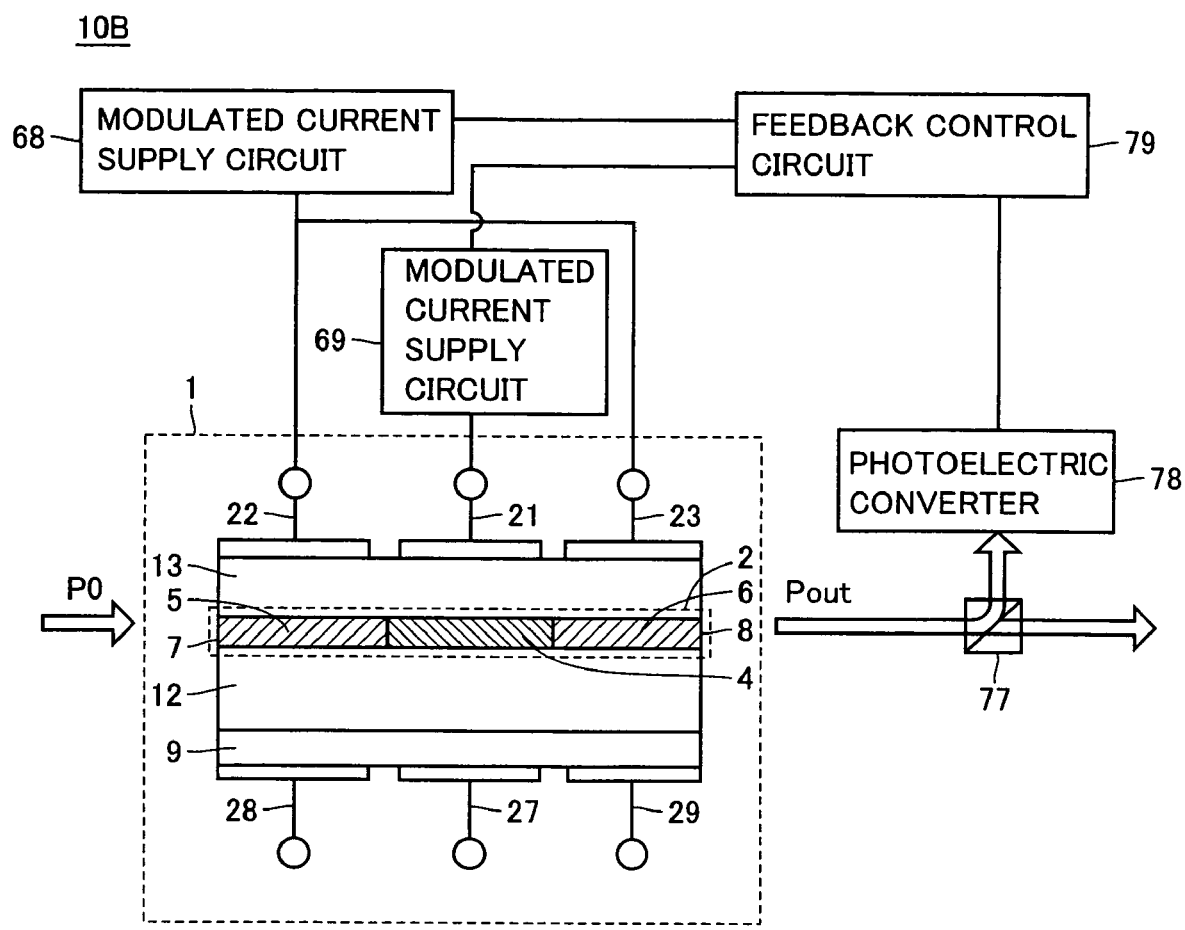

FIG. 8 shows a schematic structure of a semiconductor optical amplification driving device 10B of a third embodiment of the invention.

Referring to FIG. 8, semiconductor optical amplification driving device 10B of the third embodiment is formed of semiconductor optical amplifier device 1 and its driving device. More specifically, semiconductor optical amplification driving device 10B includes semiconductor optical amplifier device 1, modulated current supply circuits 68 and 69, a beam splitter 77, a photoelectric converter 78 and a feedback control circuit 79.

Semiconductor optical amplifier device 1 shown in FIG. 8 is the same as the semiconductor optical amplifier devices in the bistable state which have the saturable absorption regions, and are already described in connection with the first embodiment and its first to fourth modifications. Therefore, description of the same or corresponding portions is not repeated. Operation characteristics of semiconductor optical amplifier device 1 are illustrated in FIG. 5 relating to the first embodiment.

Modulated current supply circuit 68 is connected to p-electrodes 22 and 23. Modulated current supply circuit 69 is connected to p-electrode 21. Beam splitter 77 splits output light Pout of semiconductor optical amplifier device 1 to provide a part of output light Pout to photoelectric converter 78. Photoelectric converter 78 detects the part of the output light Pout split by beam splitter 77, and provides it to feedback control circuit 79. Feedback control circuit 79 is connected to modulated current supply circuits 68 and 69.

An operation of semiconductor optical amplification driving device 10B will now be described.

Semiconductor optical amplifier device 1 is supplied with light signal P0 injected through incidence plane 7 of optical amplification region 5. Light signal P0 is the same as that of the first embodiment illustrated in FIG. 2. Modulated current supply circuit 68 injects the modulated current into optical amplification regions 5 and 6 through p-electrodes 22 and 23, respectively. Modulated current supply circuit 69 injects the modulated current into saturable absorption region 4 through p-electrode 21.

Feedback control circuit 79 monitors the state of output light Pout obtained from photoelectric converter 78 through beam splitter 77. Feedback control circuit 79 provides control signals, which are adjusted to maximize the effect of reducing the bit error rate in output light Pout, to modulated current supply circuits 68 and 69, respectively.

The modulated currents supplied from modulated current supply circuits 68 and 69 via p-electrodes 21-23 are adjusted to have the intensities such that light signal P0 does not substantially exceed rising threshold PthON of semiconductor optical amplifier device 1. The modulated currents are adjusted such that "0" or "1" of light signal P0 is stochastically synchronized with the noise due to the transmission path and others, and the light signal P0 jumps between the upper and power portions of the hysteresis corresponding to "0" or "1". Thereby, the effect of reducing the bit error rate is achieved.

In the third embodiment, the noise included in light signal P0 is utilized instead of additional noise light Pn in FIG. 3. Semiconductor optical amplification driving device 10B adjusts the modulated current to be injected into semiconductor optical amplifier device 1 instead of adjusting the noise intensity, and thereby performs the control such that the binary values of light signal P0 and the noise included in light signal P0 cooperate to move output light Pout between the upper and lower portions of the hysteresis. Accordingly, light signal P0 can be amplified to improve the S/N ratio of output light Pout so that the bit error rate is reduced.

Semiconductor optical amplification driving device 10B injects the modulated currents into optical amplification regions 5 and 6 and saturable absorption region 4, and thereby controls rising threshold PthON and the hysteresis shape of semiconductor optical amplifier device 1. For such control, the hysteresis shape must be adjusted according to the noise includes in light signal P0, and therefore the feedback control of the modulated current is performed by monitoring output light Pout.

Semiconductor optical amplification driving device 10B injects the current into optical amplification regions 5, 6 and saturable absorption region 4 independently. Therefore, the injection current can be adjusted to attain the optimum state according to the noise included in light signal P0 as well as light signal P0, and the effect of reducing the bit error rate of output light Pout can be easily achieved.

Thus, semiconductor optical amplification driving device 10B adjusts the modulated current by monitoring output light Pout, and adjusts the hysteresis shape of semiconductor optical amplifier device 1 according to the state of output light Pout so that output light Pout having the amplified amplitude and the improved S/N ratio can be obtained. Thereby, the bit error rate of output light Pout is reduced.

The modulated current may be adjusted without monitoring a part extracted from output light Pout, and thereby can reduce the bit error rate of light signal P0. In this case, the beam splitter, the feedback control circuit and others are not required, but it becomes difficult to perform the adjustment for achieving the maximum effect of reducing the bit error rate.

In the third embodiment, the maximum or minimum value of light signal P0 is stochastically synchronized with the noise included in light signal P0, and output light Pout jumps between the upper and lower portions of the hysteresis when output light Pout takes the maximum or minimum value. Since semiconductor optical amplification driving device 10B does not add the noise, and utilizes the noise included in light signal P0 itself, it is required to add only a small modulated current, and a noise light supply circuit is not required. Semiconductor optical amplification driving device 10B can receive and amplify light signal P0 with lower power consumption than the case where the movement between the upper and lower portions of the hysteresis is caused by the addition of a clock signal current or the like, and further can reduce the bit error rate.

According to the third embodiment, as described above, the modulated current is injected into optical amplification regions 5, 6 and saturable absorption region 4 independently by using the noise included in light signal P0 instead of additional noise light Pn, and thereby this embodiment can provide output light Pout having the amplified amplitude and the improved S/N ratio. Therefore, the bit error rate of output light Pout is reduced.

First Modification of the Third Embodiment

A semiconductor optical amplification driving device 10Ba, which is a modification of semiconductor optical amplification driving device 10B of the third embodiment, is the same as semiconductor optical amplification driving device 10B of the third embodiment except for that semiconductor optical amplification driving device 10Ba monitors light signal P0 instead of output light Pout, and adjusts the modulated current by a control circuit already supplied with conditions which can achieve the effect of reducing the bit error rate.

More specifically, semiconductor optical amplification driving device 10Ba differs from the structure of semiconductor optical amplification driving device 10B in FIG. 8 in that beam splitter 77 is arranged in front of incidence plane 7 of optical amplification region 5 for providing a part of light signal P0 to photoelectric converter 78. Semiconductor optical amplification driving device 10Ba can likewise amplify the deteriorated signal to provide the optical output having the reduced bit error rate.

Semiconductor optical amplification driving device 10Ba monitors an average light intensity and an S/N ratio of light signal P0, and determines the optimum value of the modulated current to be injected according to the monitored values. Thereby, semiconductor optical amplification driving device 10Ba performs the adjustment to provide the optimum modulated current according to light signal P0.

In this case, the intensity of light signal P0, which was lowered by transmission loss, is further lowered, and light signal P0 thus lowered is injected into semiconductor optical amplifier device 1. However, variations in light signal P0 can be directly monitored. Therefore, it becomes easy to adjust rapidly the modulated current in response to the noise due to the transmission path and others as well as the state of light signal P0.

Second Modification of the Third Embodiment

A semiconductor optical amplification driving device 10Bb, which is another modification of semiconductor optical amplification driving device 10B of the third embodiment, is the same as semiconductor optical amplification driving device 10B of the third embodiment except for that a constant current supply circuit is connected to p-electrode 21 instead modulated current supply circuit 69. Semiconductor optical amplification driving device 10Bb can likewise amplify the deteriorated signal to provide the optical output having the reduced bit error rate.

Semiconductor optical amplification driving device 10Bb is difficult to adjust for achieving the maximum effect of reducing the bit error rate. However, only one modulated current is required, and a saturation quantity of saturable absorption region 4 can be kept constant so that the injection light and output light characteristics can be easily stabilized. Though semiconductor optical amplification driving device 10Bb monitors output light Pout, it may monitors light signal P0 similarly to semiconductor optical amplification driving device 10Ba, and thereby can likewise provide the optical output having the amplified amplitude and the reduced bit error rate.

Third Modification of the Third Embodiment

A semiconductor optical amplification driving device 10Bc, which is still another modification of semiconductor optical amplification driving device 10B of the third embodiment, is the same as semiconductor optical amplification driving device 10B of the third embodiment except for that a constant current supply circuit is connected to p-electrodes 22 and 23 instead of modulated current supply circuit 68. Semiconductor optical amplification driving device 10Bc can likewise amplify the deteriorated signal to provide the optical output having the reduced bit error rate.

Semiconductor optical amplification driving device 10Bc is difficult to adjust for achieving the maximum effect of reducing the noise. However, the injection of the modulated current into saturable absorption region 4 directly changes the threshold, and therefore output light Pout can be easily and significantly varied even if light signal P0 has a small amplitude. Therefore, the power consumption can be smaller than that in the case where the modulated current is injected into optical amplification regions 5 and 6.

The constant current can be injected into either optical amplification region 5 or 6 in semiconductor optical amplifier device 1, and in either case, the effect of reducing the bit error rate as well as the optical amplification effect can be achieved. Though semiconductor optical amplification driving device 10Bc monitors output light Pout, it may monitor light signal P0 similarly to semiconductor optical amplification driving device 10Ba, and thereby can likewise provide the optical output having the amplified amplitude and the reduced bit error rate.

Fourth Modification of the Third Embodiment

A semiconductor optical amplification driving device 10Bd, which is yet another modification of semiconductor optical amplification driving device 10B of the third embodiment, is the same as semiconductor optical amplification driving device 10B of the third embodiment except for that constant current supply circuits are connected to p-electrodes 21-23 instead of modulated current supply circuits 68 and 69. Semiconductor optical amplification driving device 10Bd can likewise amplify the deteriorated signal to provide the optical output having the reduced bit error.

Semiconductor optical amplification driving device 10Bd is difficult to adjust for achieving the maximum effect of reducing the bit error rate. However, the modulation circuit is not required, and the adjustment is not required so that the structure can be simple, and the power consumption can be small. Though semiconductor optical amplification driving device 10Bd monitors output light Pout, it may monitor light signal P0 similarly to semiconductor optical amplification driving device 10Ba, and thereby can likewise provide the optical output having the amplified amplitude and the reduced bit error rate.

Fourth Embodiment

Figure 9:
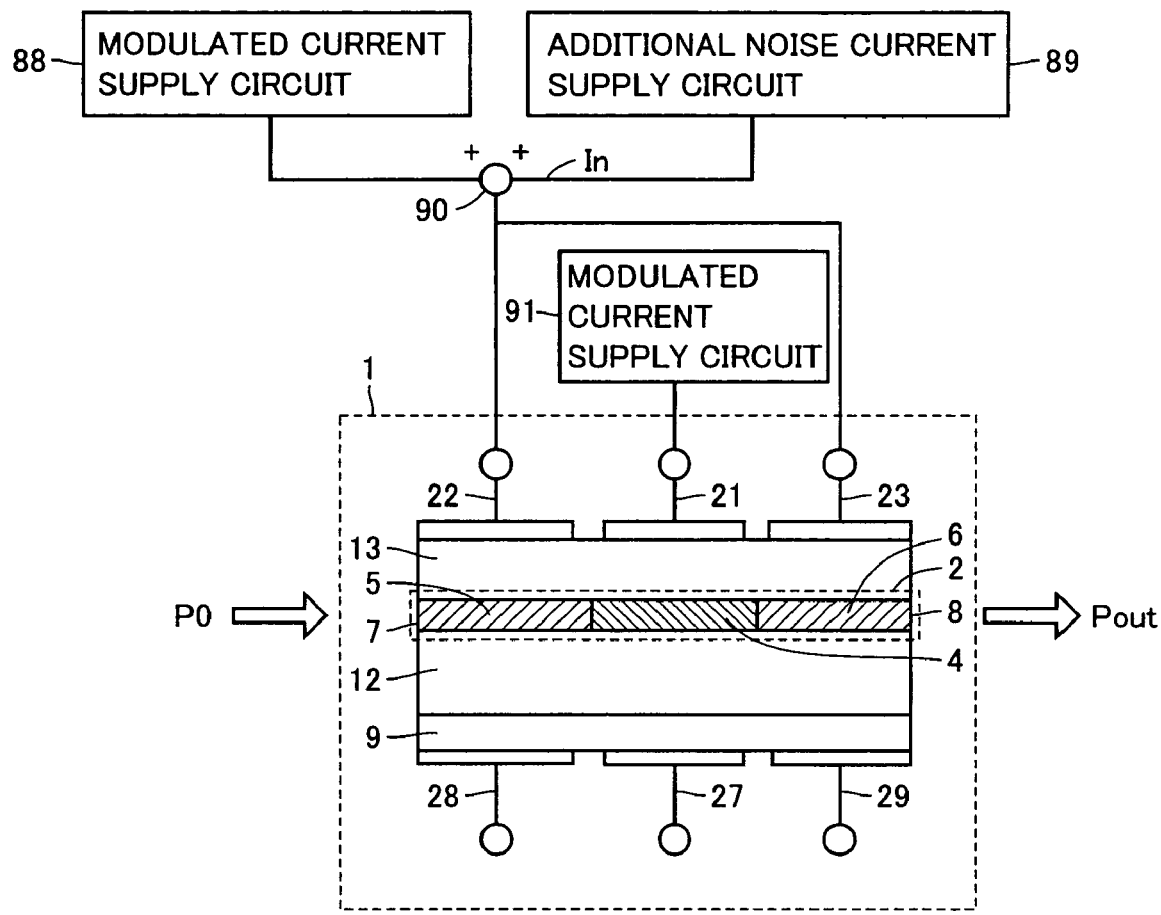

FIG. 9 shows a schematic structure of a semiconductor optical amplification driving device 10C of a fourth embodiment of the invention.

Referring to FIG. 9, semiconductor optical amplification driving device 10C of the fourth embodiment is formed of semiconductor optical amplifier device 1 and its driving device. More specifically, semiconductor optical amplification driving device 10C includes semiconductor optical amplifier device 1, modulated current supply circuits 88 and 91, an additional noise current supply circuit 89 and a coupler 90.

Semiconductor optical amplifier device 1 shown in FIG. 9 is the same as the semiconductor optical amplifier devices in the bistable state which have the saturable absorption regions, and are already described in connection with the first embodiment and its first to fourth modifications. Therefore, description of the same or corresponding portions is not repeated. Operation characteristics of semiconductor optical amplifier device 1 are the same as those of the first embodiment illustrated in FIG. 5.

Modulated current supply circuit 88 and additional noise current supply circuit 89 are connected to coupler 90. Coupler 90 is connected to p-electrodes 22 and 23. Modulated current supply circuit 91 is connected to p-electrode 21. Additional noise current supply circuit 89 supplies a current In as the additional noise having the intensity variations of colored noise.

An operation of semiconductor optical amplification driving device 10C will now be described. In the following description, such light will be referred to as an "additional noise current" that has an intensity changing noncyclically and randomly, and is injected into the active layer as noise with respect to the modulated current.

Figure 10:
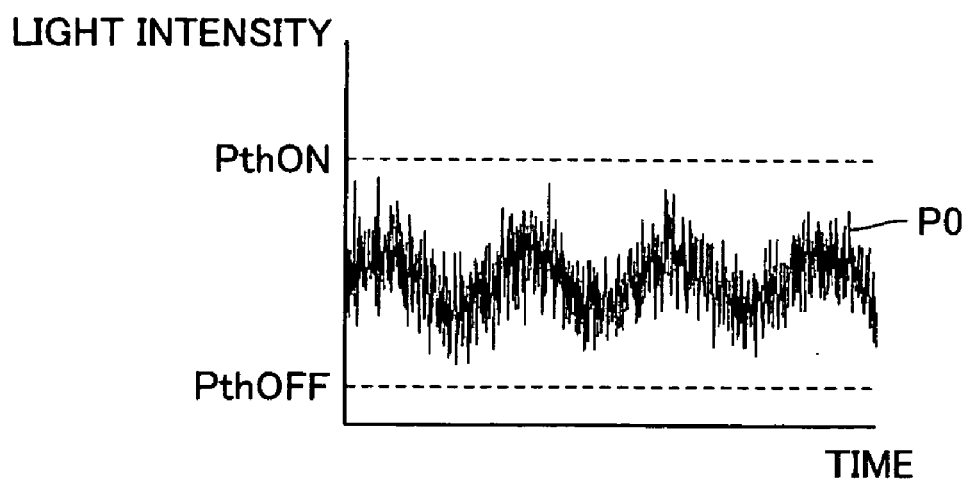
FIG. 10 illustrates a time waveform of light signal P0 applied into semiconductor optical amplifier device 1 in FIG. 9.
Figure 11:
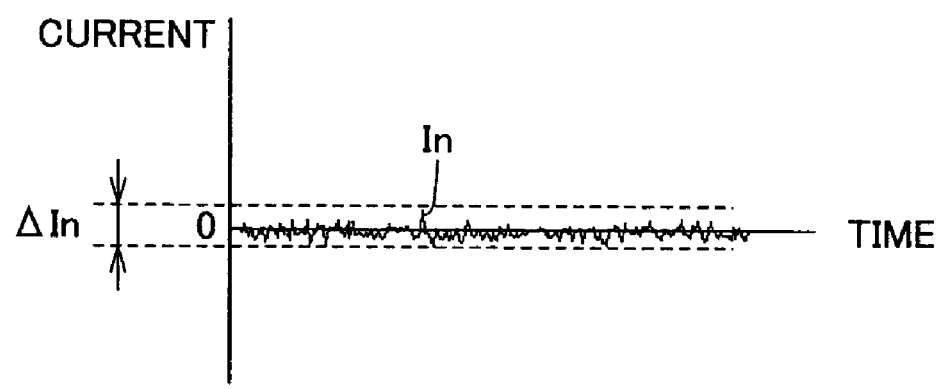
FIG. 11 illustrates a time waveform of additional noise current In produced by an additional noise current supply circuit 89.

FIGS. 10 and 11 illustrate light signal P0, which is injected into active layer 2 of semiconductor optical amplifier device 1 in semiconductor optical amplification driving device 10C, as well as additional noise current In added to the modulated current.

FIG. 10 illustrates a time waveform of light signal P0 applied into semiconductor optical amplifier device 1 in FIG. 9. As illustrated in FIG. 10, light signal P0 is lower than rising threshold PthON of semiconductor optical amplifier device 1.

FIG. 11 illustrates a time waveform of additional noise current In produced from additional noise current supply circuit 89. Additional noise current In is stochastically synchronized with the modulated current provided from modulated current supply circuit 88, and is injected into active layer 2 of semiconductor optical amplifier device 1 via p-electrode 22 after being coupled to the modulated current thus synchronized.

The current value and cut-off frequency of additional noise current In are appropriately adjusted such that output light Pout can achieve the effect of reducing the bit error rate. In the following description, a difference between the maximum and minimum current values of additional noise current In will be referred to as a maximum amplitude ΔIn of additional noise current In. Maximum amplitude ΔIn of additional noise current In is adjusted to be equal to or lower than the current value of the modulated current provided from modulated current supply circuit 88.

As illustrated in FIG. 9, coupler 90 couples the modulated current provided from modulated current supply circuit 88 and additional noise current In having the intensity change of the colored noise. The injection current produced by this coupling is injected into optical amplification regions 5 and 6 via p-electrodes 22 and 23, respectively. The modulated current provided from modulated current supply circuit 91 is injected into saturable absorption region 4 via p-electrode 21 independently of the foregoing injection current.

Referring to FIG. 10, rising threshold PthON of the hysteresis is set higher than the intensity of light signal P0. Therefore, when light signal P0 is merely injected into active layer 2, output light Pout remains at the lower hysteresis portion on the injection light and optical output characteristic curve at (a) in FIG. 5, and cannot move to the upper hysteresis portion.

Referring to FIG. 9, photons are generated by the injection of carriers into active layer 2 which occurs as a result of the injection of additional noise current In, and the photons thus generated are applied to the photons which are injected into active layer 2 of semiconductor optical amplifier device 1 by light signal P0. Thereby, the photons in optical amplification regions 5 and 6 increase so that output light Pout can easily exceed rising threshold PthON.

Also, the quantity of increase of the carriers varies according to the variations in additional noise current In. Therefore, by adjusting maximum amplitude ΔIn and the cut-off frequency of additional noise current In in an optimum manner to move rising threshold PthON up or down in response to "0" or "1" of light signal P0, it is possible to provide output light Pout having the large amplitude and the improved S/N ratio.

According to the fourth embodiment, maximum amplitude ΔIn and the cut-off frequency of additional noise current In are adjusted in an optimum manner to maximize the effect of reducing the bit error rate. Consequently, the noise due to the transmission path and others can be significantly reduced. Since light signal P0 can be equal to or lower than rising threshold PthON of semiconductor optical amplifier device 1, light signal P0 can be amplified even if it is weak.

As illustrated in FIG. 9, semiconductor optical amplification driving device 10C injects the current into optical amplification regions 5, 6 and saturable absorption region 4 of semiconductor optical amplifier device 1 independently. Therefore, semiconductor optical amplification driving device 10C can control the hysteresis by the current injection so that rising threshold PthON can be lowered for driving with a low current and the amplitude of output light Pout can be adjusted.

Additional noise current In can be injected into saturable absorption region 4 of semiconductor optical amplifier device 1 instead of optical amplification regions 5 and 6, and thereby output light Pout having the reduced bit error rate can likewise be obtained. In this case, saturable absorption region 4 is more likely to be saturated so that the upper limit value of the injectable current lowers, and it becomes difficult to determine appropriately maximum amplitude ΔIn of additional noise current In. However, the injection of additional noise current In into saturable absorption region 4 facilitates the adjustment of the hysteresis shape.

According to the quantity of additional noise current In injected into saturable absorption region 4, the adjustment can be performed by varying threshold PthON or PthOFF of semiconductor optical amplifier device 1. Therefore, maximum amplitude ΔIn and the cut-off frequency of additional noise current In can be appropriately adjusted to move rising threshold PthON up or down in response to "0" or "1" of light signal P0 so that it is possible to provide output light Pout having the large amplitude and the improved S/N ratio.

Instead of injecting additional noise current In after adding it to the modulated current, which is to be injected into optical amplification region 5, additional noise current In may be injected directly into p-electrode 22. In this case, adjustment must be performed with respect to the modulated current injected into optical amplification region 5. However, the current value and the cut-off frequency of additional noise current In can be adjusted more easily.

Through maximum amplitude ΔIn of additional noise current In is adjusted to be equal to or lower than the current value of the modulated current supplied from modulated current supply circuit 88, the effect of reducing the bit error rate can be achieved even when it is larger than the current value of the modulated current. However, if additional noise current In is excessively strong, the waveform of output light Pout deforms so that it becomes difficult to achieve the effect of improving the S/N ratio. At least in the case where maximum amplitude ΔIn of additional noise current In is larger than the current value of the modulated current, the waveform and the period of light signal P0 cannot be reproduced so that light signal P0 cannot be reproduced.

In contrast to this, when maximum amplitude ΔIn of additional noise current In is equal to or lower than the current value of the modulated current, the amplitude of output light Pout can be further increased, and the effect of reducing the noise due to the transmission path and others can be improved. Thereby, the bit error rate can be reduced, and such setting is desirable.

Even when the cut-off frequency of additional noise current In is not adjusted in the optimum manner, the effect of reducing the bit error rate can be achieved. However, the cut-off frequency affects maximum amplitude ΔIn of additional noise current In, and therefore the adjustment of the cut-off frequency can provide better additional noise current In. Thereby, the bit error rate can be reduced, and such adjustment is desirable.

Though additional noise current In is formed of the colored noise, additional noise current In other than the colored noise can achieve the effect of reducing the bit error rate provided that the intensity changes noncyclically and randomnly. When the colored noise is used, however, the frequency band of the colored noise can be adjusted according to the cut-off frequency. Therefore, the effect of reducing the bit error rate can be achieved more easily by adjusting the frequency band of the colored noise according to the frequency of light signal P0.

According to the fourth embodiment, as described above, additional noise light is not inject, and alternatively additional noise current In is coupled to the modulated current provided from modulated current supply circuit 88, and is injected into active layer 2 of semiconductor optical amplifier device 1 so that output light Pout having the amplified amplitude and the improved S/N ratio can be obtained. Thereby, the bit error rate of output light Pout is reduced.

First Modification of the Fourth Embodiment

A semiconductor optical amplification driving device 10Ca, which is a modification of semiconductor optical amplification driving device 10C of the fourth embodiment, is the same as semiconductor optical amplification driving device 10C of the fourth embodiment except for that white noise is used as the additional noise current instead of colored noise. Semiconductor optical amplification driving device 10Ca can likewise amplify the deteriorated signal to provide the optical output having the reduced bit error rate.

Semiconductor optical amplification driving device 10Ca cannot adjust the cut-off frequency of the additional noise current for achieving the maximum effect of reducing the bit error rate, and it becomes difficult to cause a stochastic resonance phenomenon. However, semiconductor optical amplification driving device 10Ca has an advantage that the structure is simple and the packaging is compact.

Second Modification of the Fourth Embodiment

A semiconductor optical amplification driving device 10Cb, which is another modification of semiconductor optical amplification driving device 10C of the fourth embodiment, is the same as semiconductor optical amplification driving device 10C of the fourth embodiment except for that a constant current supply circuit is connected to p-electrode 21 instead of modulated current supply circuit 91. Semiconductor optical amplification driving device 10Cb can likewise amplify the deteriorated signal to provide the optical output having the reduced bit error rate.

Though semiconductor optical amplification driving device 10Cb is difficult to adjust for achieving the maximum effect of reducing the bit error rate, it requires only one modulation circuit, and can keep a constant saturation quantity in saturable absorption region 4 so that the injection light and output light characteristics can be stabilized more easily. Though semiconductor optical amplification driving device 10Cb uses the colored noise as the additional noise current, it may use the white noise similarly to semiconductor optical amplification driving device 10Ca, in which case the optical output having the amplified amplitude and the reduced bit error rate can be obtained.

Third Modification of the Fourth Embodiment

A semiconductor optical amplification driving device 10Cc, which is still another modification of semiconductor optical amplification driving device 10C of the fourth embodiment, is the same as semiconductor optical amplification driving device 10C of the fourth embodiment except for that a constant current supply circuit is connected to p-electrodes 22 and 23 through coupler 90 instead of modulated current supply circuit 88. Semiconductor optical amplification driving device 10Cc can likewise amplify the deteriorated signal to provide the optical output having the reduced bit error rate.

Semiconductor optical amplification driving device 10Cc is difficult to adjust for achieving the maximum effect of reducing the noise. However, the injection of the modulated current into saturable absorption region 4 directly changes the threshold, and therefore it is easy to vary significantly output light Pout even if light signal P0 has a small amplitude. Therefore, the power consumption can be smaller than that in the case where the modulated current is injected into optical amplification regions 5 and 6.

The constant current can be injected into either optical amplification region 5 or 6 in semiconductor optical amplifier device 1, and in either case, the effect of reducing the bit error rate as well as the optical amplification effect can be achieved. Though semiconductor optical amplification driving device 10Cc uses the colored noise as the additional noise current, it may use the white noise similarly to semiconductor optical amplification driving device 10Ca, in which case the optical output having the amplified amplitude and the reduced bit error rate can be obtained.

Third Modification of the Fourth Embodiment

A semiconductor optical amplification driving device 10Cd, which is yet another modification of semiconductor optical amplification driving device 10C of the fourth embodiment, is the same as semiconductor optical amplification driving device 10C of the fourth embodiment except for that a constant current supply circuit is used instead of modulated current supply circuits 88 and 91. Semiconductor optical amplification driving device 10Cd can likewise amplify the deteriorated signal to provide the optical output having the reduced bit error rate.

Semiconductor optical amplification driving device 10Cd is difficult to adjust for achieving the maximum effect of reducing the noise. However, it does not require the modulation circuit so that the structure is simple, the packaging is compact and the power consumption is reduced. Though semiconductor optical amplification driving device 10Cd uses the colored noise as the additional noise current, it may use the white noise similarly to semiconductor optical amplification driving device 10Ca, in which case the optical output having the amplified amplitude and the reduced bit error rate can be obtained.

Fifth Embodiment

Figure 12:
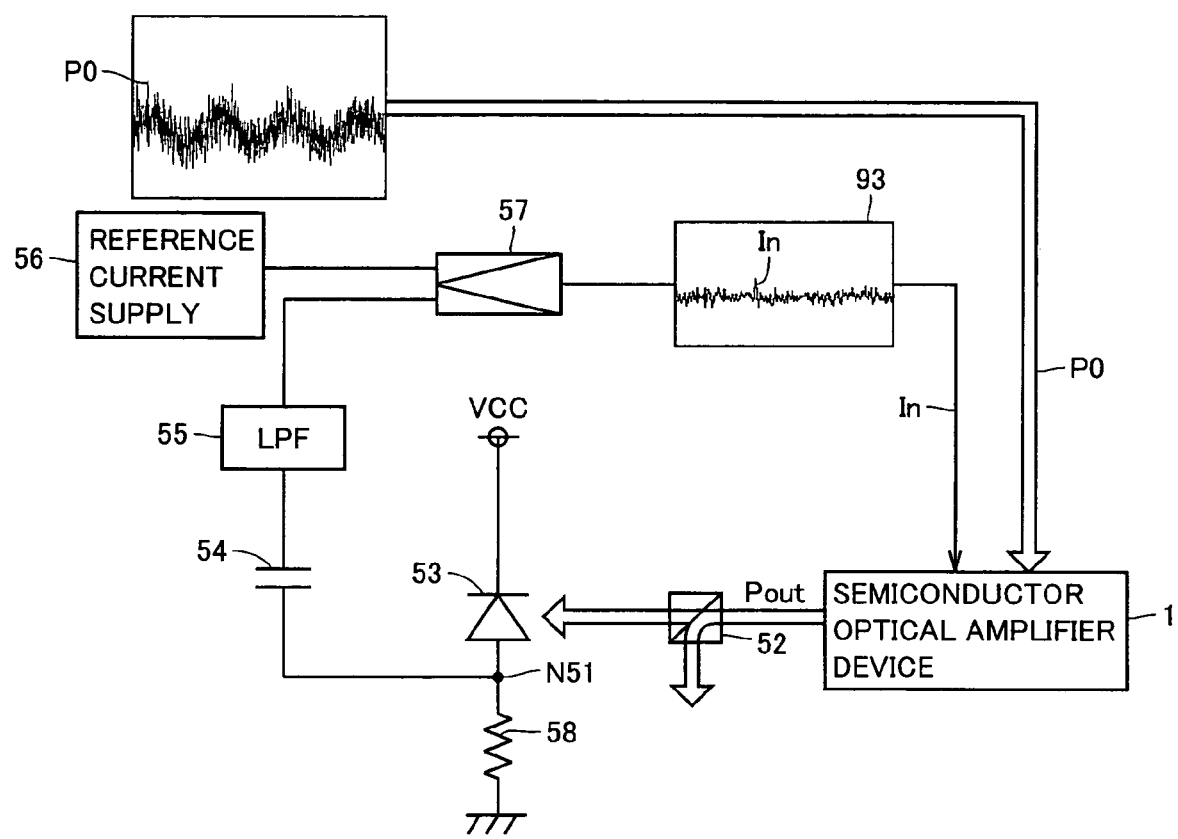
FIG. 12 schematically shows a semiconductor optical amplification driving device 10D of a fifth embodiment of the invention.

FIG. 12 shows a schematic structure of a semiconductor optical amplification driving device 10D of a fifth embodiment of the invention.

Referring to FIG. 12, semiconductor optical amplification driving device 10D of the fifth embodiment is the same as semiconductor optical amplification driving device 10A of the second embodiment except for that light source 59 is replaced with an additional noise current supply circuit 93. Therefore, description of the same or corresponding portions is not repeated.

Additional noise current supply circuit 93 receives the adjusted current from preamplifier 57, and injects additional noise current In into the optical amplification region of semiconductor optical amplifier device 1. Additional noise current In has the appropriate intensity adjusted to reduce the bit error rate of output light Pout. Also, additional noise current In has the maximum amplitude $\Delta$In adjusted to be equal to or lower than the current value of the modulated current which is injected into the optical amplification region of semiconductor optical amplifier device 1.

The cooperative effect of light signal P0 and additional noise current In provides output light Pout having the amplified amplitude and the reduced bit error rate. As already described in connection with the first embodiment, the modulated current other than additional noise current In is injected into each of the optical amplification regions and the saturable absorption region of semiconductor optical amplifier device 1 independently of the others.

Since semiconductor optical amplification driving device 10D of the fifth embodiment produces additional noise current In by utilizing output light Pout as described above, a noise current supply is not required, and additional noise current In can be generated by a simple device structure. Consequently, semiconductor optical amplification driving device 10D can provide high output light Pout, in which the noise due to the transmission path and others is reduced, with low power consumption and a low load on the circuits. Thereby, the bit error rate of output light Pout can be reduced.

Though maximum amplitude $\Delta$In of additional noise current In is equal to or larger than the current value of the modulated current injected into semiconductor optical amplifier device 1, it may be larger than the current value of the modulated current provided that the effect of reducing the bit error rate is achieved. However, it is desirable that maximum amplitude $\Delta$In of additional noise current In is equal to or smaller than the current value of the modulated current because such maximum amplitude $\Delta$In can further enhance the effect of improving the S/N ratio, and can reduce the bit error rate.

The modulated current(s) injected into the optical amplification regions and/or saturable absorption region of semiconductor optical amplifier device 1 may be a constant current. Even if it is the constant current, the optical output having the amplified amplitude and the reduced bit error rate can be provided.

Additional noise current In may be injected into the saturable absorption region of semiconductor optical amplifier device 1 instead of optical amplification regions, and thereby the optical output having the reduced bit error rate can likewise be obtained. In this case, the saturable absorption region is more likely to be saturated so that the upper limit of the current value lowers, and it becomes difficult to determine appropriately the maximum amplitude of additional noise current In. However, the injection of additional noise current In into the saturable absorption region facilitates the adjustment of the hysteresis shape.

Further, thresholds PthON and PthOFF of semiconductor optical amplifier device 1 can be changed and adjusted according to the quantity of additional noise current In injected into the saturable absorption region. Accordingly, maximum amplitude ΔIn and the cut-off frequency of additional noise current In can be adjusted in an optimum manner to move rising threshold PthON up or down according to "0" or "1" of light signal P0. Therefore, output light Pout having the large amplitude and the improved S/N ratio can be provided.

As described above, the fifth embodiment does not employ the noise current supply. Alternatively, photoelectric converter 53 detects a part of output light Pout of semiconductor optical amplifier device 1, and additional noise current In is produced based on the detected part so that high output light Pout having the improved S/N ratio can be produced with low power consumption and a load on the circuit. Thereby, the bit error rate of output light Pout is reduced.

Sixth Embodiment

Figure 13:
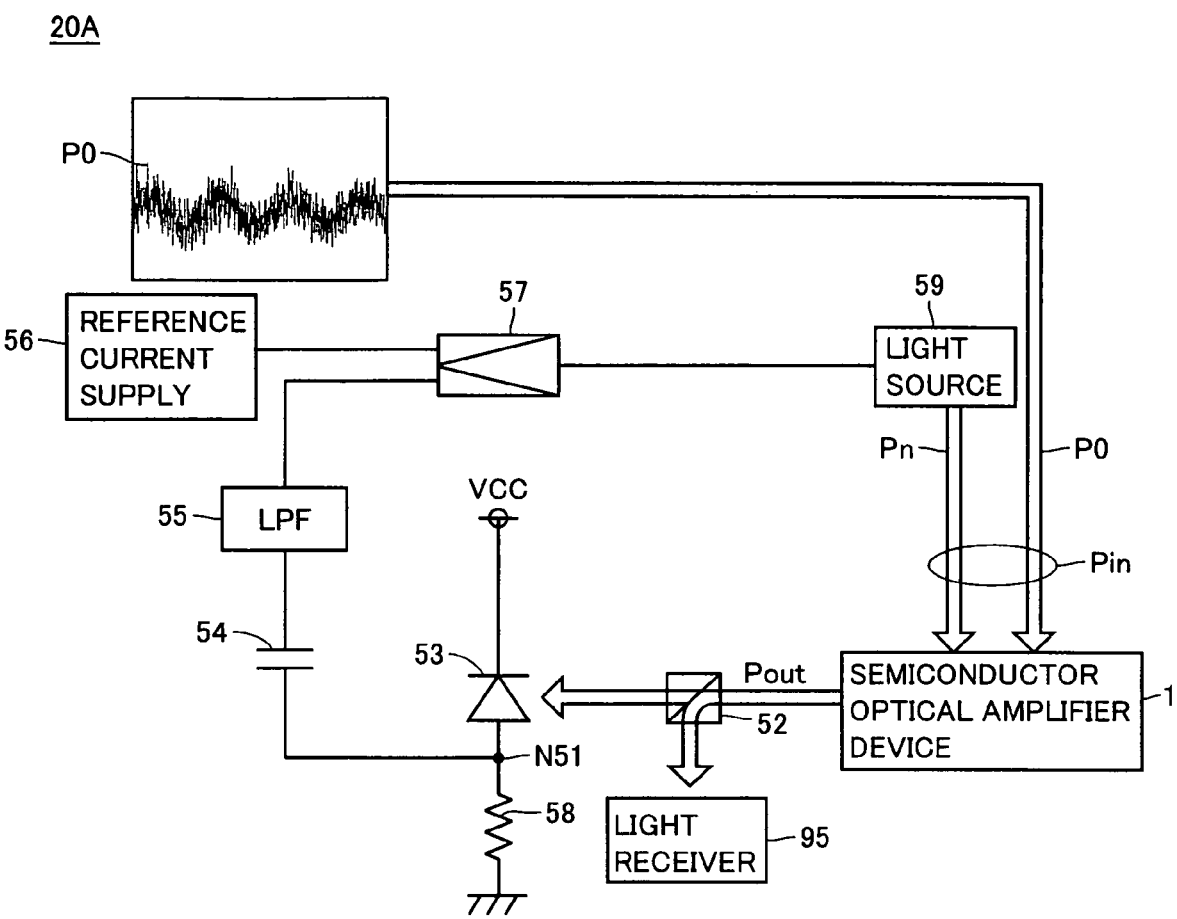
FIGS. 13, 14, 15 and 16 schematically show structures of semiconductor light receiving apparatus 20A, 20B, 20C and 20D of sixth, seventh, eighth and ninth embodiments of the invention, respectively.

FIG. 13 shows a schematic structure of a semiconductor light receiving apparatus 20A of a sixth embodiment of the invention.

Referring to FIG. 13, semiconductor light receiving apparatus 20A of the sixth embodiment has a structure of semiconductor optical amplification driving device 10A of the second embodiment, and also has a light receiver 95 added thereto. Light receiver 95 receives a part of output light Pout split and provided from beam splitter 52.

Light receiver 95 may be a photoelectric converter. In this case, it converts a part of received output light Pout into an electric signal. This can achieve an advantage that output light Pout, which is amplified and has a shaped waveform, can be received as an electric signal.

Semiconductor optical amplification driving device 10A and light receiver 95 may be integrated on the same substrate. The integration on the same substrate can reduce a cost as compared with individual arrangement, and makes it unnecessary to align optical axes of semiconductor optical amplifier device 1 and light receiver 95.

According to the sixth embodiment of the invention, as described above, light receiver 95 is added to semiconductor optical amplification driving device 10A to form the semiconductor light receiving apparatus so that the whole device can be compact, and the cost reduction as well as yield rate can be improved.

Seventh Embodiment

Figure 14:
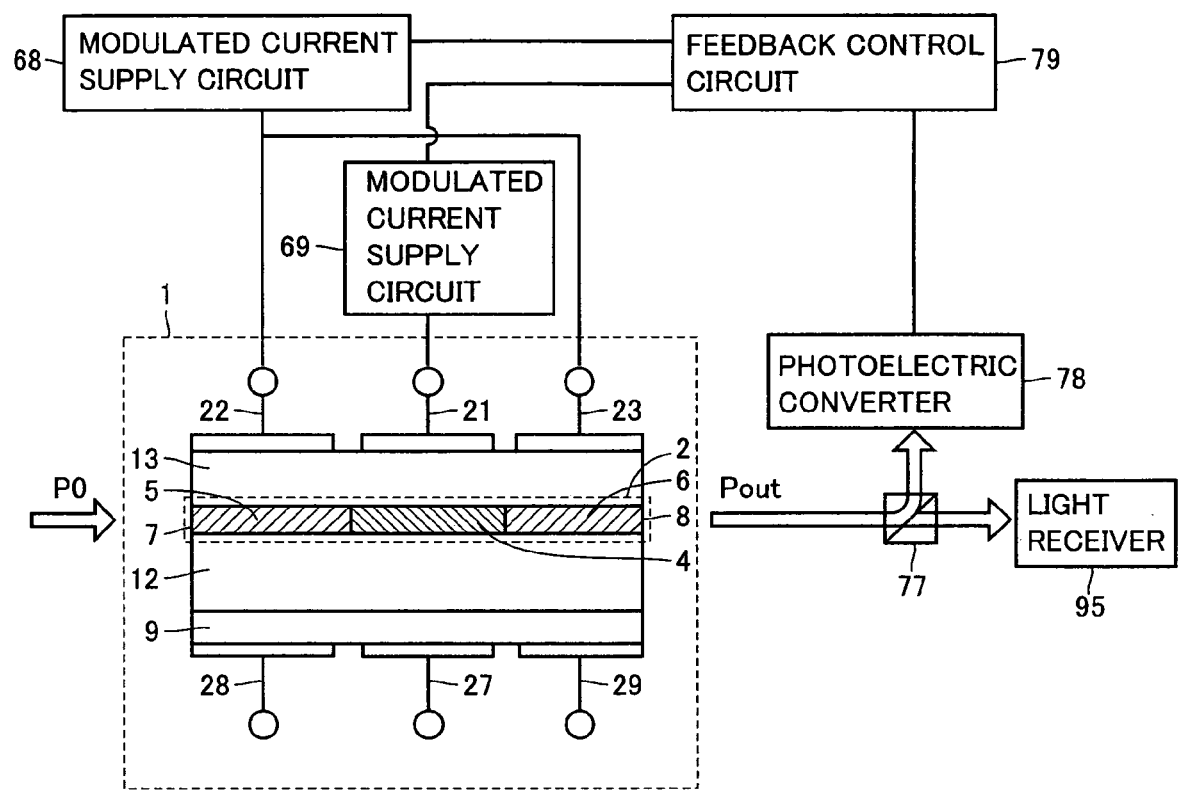

FIG. 14 shows a schematic structure of a semiconductor light receiving apparatus 20B of a seventh embodiment of the invention.

Referring to FIG. 14, semiconductor light receiving apparatus 20B of the seventh embodiment has a structure of semiconductor optical amplification driving device 10B of the third embodiment (or its first to fourth modifications), and also has light receiver 95 added thereto. Light receiver 95 receives a part of output light Pout split and provided from beam splitter 77.

Light receiver 95 may be a photoelectric converter. In this case, it converts a part of received output light Pout into an electric signal. This can achieve an advantage that output light Pout, which is amplified and has a shaped waveform, can be received as an electric signal.

Semiconductor optical amplification driving device 10B and light receiver 95 may be integrated on the same substrate. The integration on the same substrate can reduce a cost as compared with individual arrangement, and makes it unnecessary to align optical axes of semiconductor optical amplifier device 1 and light receiver 95.

According to the seventh embodiment of the invention, as described above, light receiver 95 is added to semiconductor optical amplification driving device 10B to form the semiconductor light receiving apparatus so that the whole device can be compact, and the cost reduction as well as yield rate can be improved.

Eighth Embodiment

Figure 15:
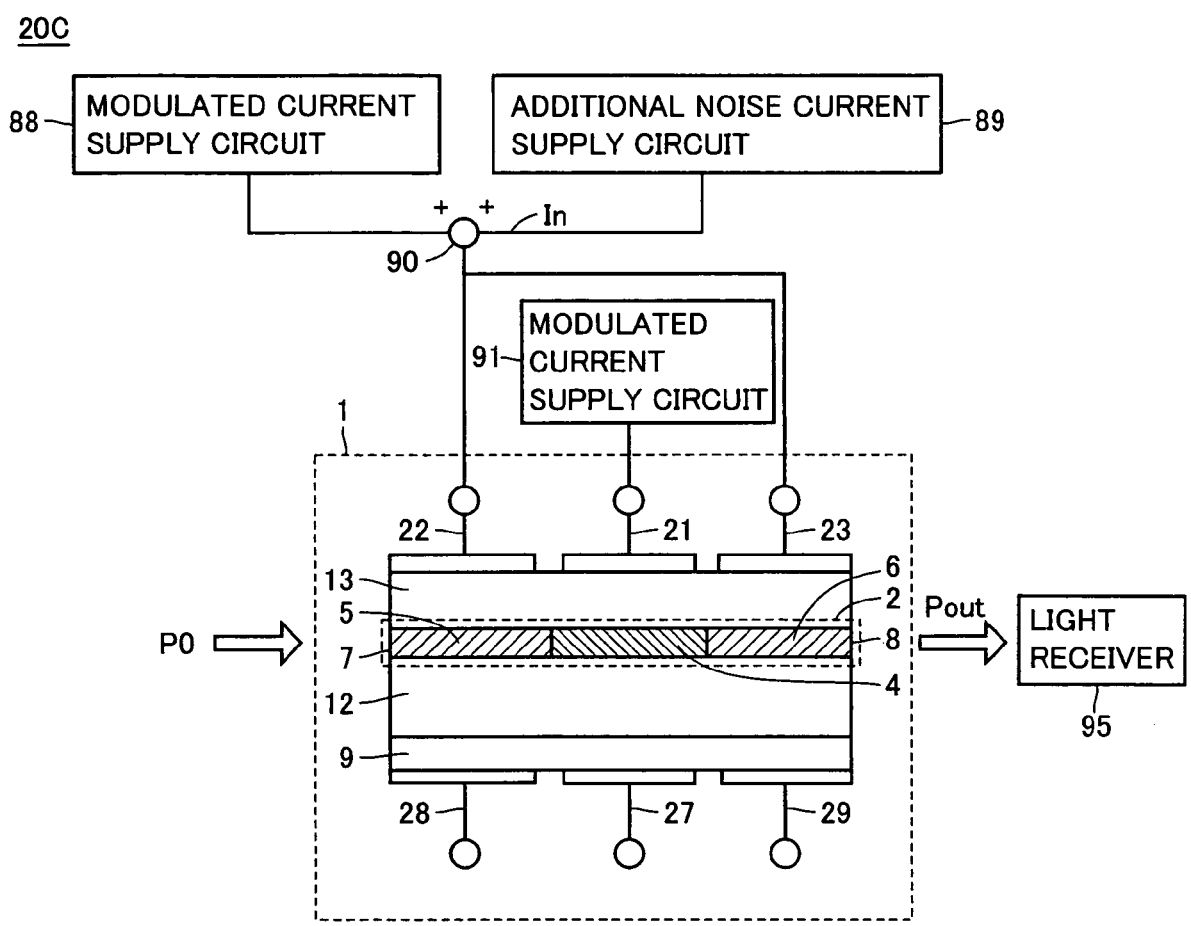

FIG. 15 shows a schematic structure of a semiconductor light receiving apparatus 20C of an eighth embodiment of the invention.

Referring to FIG. 15, semiconductor light receiving apparatus 20C of the eighth embodiment has a structure of semiconductor optical amplification driving device 10C of the fourth embodiment (or its first to fourth modifications), and also has light receiver 95 added thereto. Light receiver 95 receives output light Pout semiconductor optical amplifier device 1.

Light receiver 95 may be a photoelectric converter. In this case, it converts a part of received output light Pout into an electric signal. This can achieve an advantage that output light Pout, which is amplified and has a shaped waveform, can be received as an electric signal.

Semiconductor optical amplification driving device 10C and light receiver 95 may be integrated on the same substrate. The integration on the same substrate can reduce a cost as compared with individual arrangement, and makes it unnecessary to align optical axes of semiconductor optical amplifier device 1 and light receiver 95.

According to the eighth embodiment of the invention, as described above, light receiver 95 is added to semiconductor optical amplification driving device 10C to form the semiconductor light receiving apparatus so that the whole device can be compact, and the cost reduction as well as yield rate can be improved.

Ninth Embodiment

Figure 16:
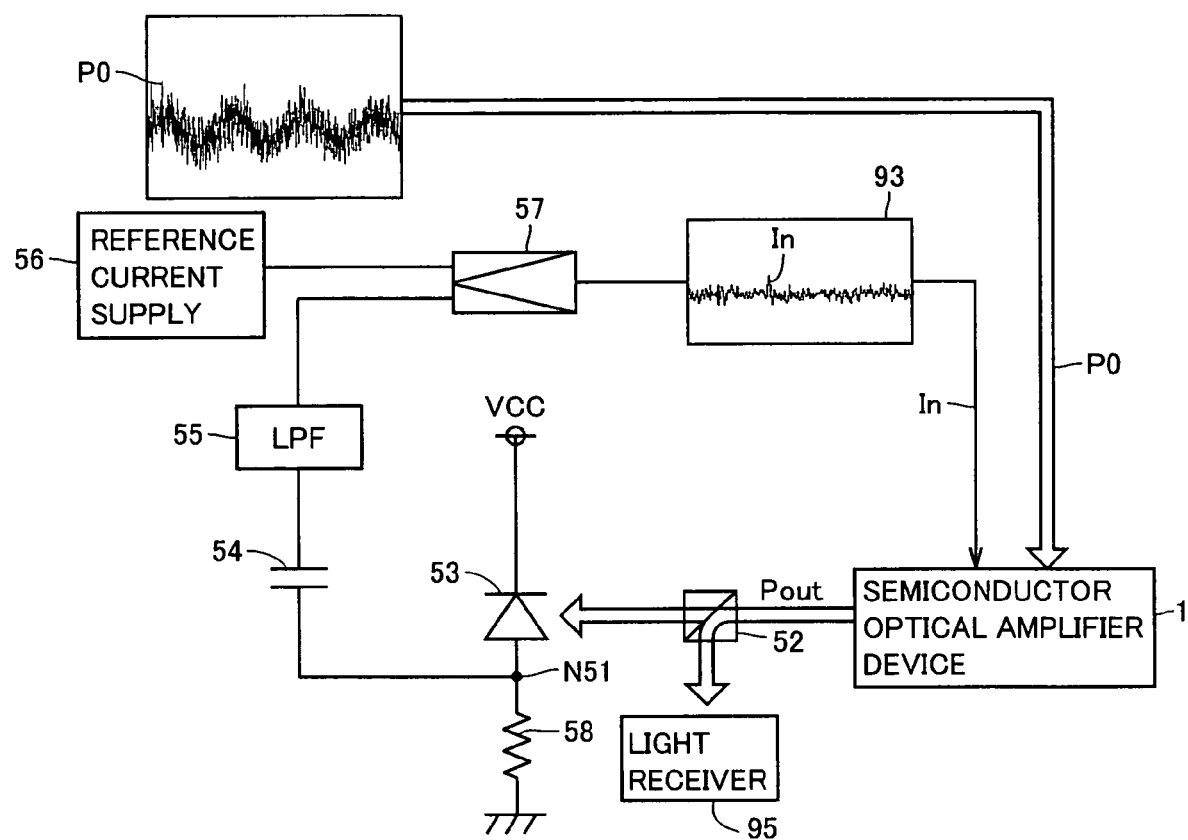

FIG. 16 shows a schematic structure of a semiconductor light receiving apparatus 20D of an ninth embodiment of the invention.

Referring to FIG. 16, semiconductor light receiving apparatus 20D of the ninth embodiment has a structure of semiconductor optical amplification driving device 10D of the fifth embodiment, and also has light receiver 95 added thereto. Light receiver 95 receives a part of output light Pout split and provided from beam splitter 52.

Light receiver 95 may be a photoelectric converter. In this case, it converts a part of received output light Pout into an electric signal. This can achieve an advantage that output light Pout, which is amplified and has a shaped waveform, can be received as an electric signal.

Semiconductor optical amplification driving device 10D and light receiver 95 may be integrated on the same substrate. The integration on the same substrate can reduce a cost as compared with individual arrangement, and makes it unnecessary to align optical axes of semiconductor optical amplifier device 1 and light receiver 95.

According to the ninth embodiment of the invention, as described above, light receiver 95 is added to semiconductor optical amplification driving device 10D to form the semiconductor light receiving apparatus so that the whole device can be compact, and the cost reduction as well as yield rate can be improved.

Though the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor amplifier device for amplifying a light signal comprising:
    an active layer including an optical amplification region and a saturable absorption region;
    an electrode of a first polarity type; and
    an electrode of a second polarity type opposed to said electrode of the first polarity type, wherein
    at least one of said electrodes of the first and second polarity types is divided for injecting a current into each of said optical amplification region and said saturable absorption region independently of the other, and
    said active layer receives injection light including said light signal, and emits output light produced by amplifying said injection light, wherein
    the current injected into said optical amplification region and said saturable absorption region has an intensity adjusted to increase an amplitude of said output light and to reduce a bit error rate of said light signal by synchronizing an intensity of the light signal with that of a noise signal stochastically.

2. The semiconductor optical amplifier device according to claim 1, wherein
    said optical amplification region includes first and second optical amplification regions arranged on the opposite sides of said saturable absorption region, respectively, and
    said injection light enters through an end plane of one of said first and second optical amplification regions, and said output light is emitted from an end plane of the other of said first and second optical amplification regions.

3. The semiconductor optical amplifier device according to claim 1, wherein
    a ratio of a length of said saturable absorption region to that of said active layer region in an oscillator direction is in a range equal to or higher than 1% and smaller than 50%.

4. The semiconductor optical amplifier device according to claim 1, wherein the current injected into said optical amplification region is a modulated current.

5. The semiconductor optical amplifier device according to claim 1, wherein the current injected into said optical amplification region is a constant current.

6. The semiconductor optical amplifier device according to claim 1, wherein the current injected into said saturable absorption region is a modulated current.

7. The semiconductor optical amplifier device according to claim 1, wherein the current injected into said saturable absorption region is a constant current.

8. The semiconductor optical amplifier device according to claim 1, wherein said injection light is produced by superimposing said light signal and noise light on each other.

9. The semiconductor optical amplifier device according to claim 8, wherein said noise light has a randomly changing intensity.

10. The semiconductor optical amplifier device according to claim 8, wherein said noise light is stochastically synchronized with said light signal.

11. The semiconductor optical amplifier device according to claim 8, wherein said noise light has an intensity adjusted to attain an optimum noise intensity minimizing a bit error rate of said light signal.

12. The semiconductor optical amplifier device according to claim 8, wherein the noise light has a cut-off frequency adjusted to reduce a bit error rate of said light signal.

13. The semiconductor optical amplifier device according to claim 8, wherein a difference between maximum and minimum values of said noise light is equal to or lower than 1/10 of the amplitude of said light signal.

14. The semiconductor optical amplifier device according to claim 8, wherein said noise light is noise light of colored noise.

15. The semiconductor optical amplifier device according to claim 8, wherein said noise light is noise light of white noise.

16. The semiconductor optical amplifier device according to claim 1, wherein said semiconductor optical amplifier device is a semiconductor laser in a bistable state.

* * * * *

UNITED STATES PATENT AND TRADEMARK OFFICE
CERTIFICATE OF CORRECTION

PATENT NO. : 7,274,010 B2  
APPLICATION NO. : 11/217590  
DATED : September 25, 2007  
INVENTOR(S) : Kyoko Matsuda et al.

It is certified that error appears in the above-identified patent and that said Letters Patent is hereby corrected as shown below:

In Claim 1, column 31, line 29, please add --optical-- in between "semiconductor" and "amplifier."

Signed and Sealed this

Tenth Day of June, 2008

JON W. DUDAS  
*Director of the United States Patent and Trademark Office*